United States Patent
Tarof et al.

(10) Patent No.: US 12,218,157 B2
(45) Date of Patent: Feb. 4, 2025

(54) OPTICAL RECEIVER COMPRISING MONOLITHICALLY INTEGRATED PHOTODIODE AND TRANSIMPEDANCE AMPLIFIER

(71) Applicant: ElectroPhotonic-IC Inc., Kanata (CA)

(72) Inventors: Lawrence E. Tarof, Kanata (CA); William A. Hagley, Ottawa (CA); Gudmundur A. Hjartarson, Ottawa (CA); John William Mitchell Rogers, Nepean (CA)

(73) Assignee: ElectroPhotonic-IC Inc., Kanata (CA)

( * ) Notice: Subject to any disclaimer, the term of this patent is extended or adjusted under 35 U.S.C. 154(b) by 405 days.

(21) Appl. No.: 17/785,989

(22) PCT Filed: Dec. 4, 2020

(86) PCT No.: PCT/CA2020/051666
§ 371 (c)(1),
(2) Date: Jun. 16, 2022

(87) PCT Pub. No.: WO2021/119803
PCT Pub. Date: Jun. 24, 2021

(65) Prior Publication Data
US 2023/0019783 A1  Jan. 19, 2023

Related U.S. Application Data

(60) Provisional application No. 62/950,479, filed on Dec. 19, 2019.

(51) Int. Cl.
*H01L 27/144* (2006.01)
*H04B 10/60* (2013.01)

(52) U.S. Cl.
CPC .......... *H01L 27/1443* (2013.01); *H04B 10/60* (2013.01)

(58) Field of Classification Search
CPC ... H01L 27/14; H01L 27/144; H01L 27/1443; H01L 27/1446; H01L 31/0248;
(Continued)

(56) References Cited

U.S. PATENT DOCUMENTS 5,063,426 A * 11/1991 Chandrasekhar ... H01L 27/1443
257/E27.128
5,475,256 A * 12/1995 Sawada ............... H01L 27/1443
257/E27.128
(Continued)

FOREIGN PATENT DOCUMENTS

EP          3054489 B1      1/2020
WO       2015054469 A1     4/2015

OTHER PUBLICATIONS

S. Chandrasekhar, et al., "Eight-Channel p-i-n/HBT Monolithic Receiver Array at 2.5Gb/s Per Channel for WDM Applications", IEEE Photonics Technology Letters, vol. 6, No. 10, pp. 1216-1218, Oct. 1994, doi: 10.1109/68.329643.
(Continued)

*Primary Examiner* — John R Lee
(74) *Attorney, Agent, or Firm* — Miltons IP/p.i.

(57) ABSTRACT

An optical receiver comprises a monolithically integrated pin photodiode (PIN) and transimpedance amplifier (TIA). The TIA comprises InP heterojunction bipolar transistors (HBT) fabricated from a first plurality of layers of an epitaxial layer stack grown on a SI:InP substrate; the PIN is fabricated from a second plurality of layers of the epitaxial layer stack. The p-contact of the PIN is directly connected to the input of the TIA to reduce PIN capacitance $C_{PIN}$. The TIA capacitance $C_{TIA}$ may be matched to $C_{PIN}$. Device parameters comprising: a thickness of the absorption layer, window area, and an optional mirror thickness of the PIN; device capacitance $C_{PIN}+C_{TIA}$; and feedback resistance $R_F$ of the TIA; are optimized to performance specifications
(Continued)

comprising a specified sensitivity and responsivity at an operational wavelength. This design approach enables cost-effective fabrication an integrated PIN-TIA, for applications such as a 1577 nm receiver for an ONU for 10G-PON.

32 Claims, 13 Drawing Sheets

(58) Field of Classification Search
CPC ............. H01L 31/0256; H01L 31/0264; H01L 31/0304; H01L 31/03042; H01L 31/00046; H01L 31/102; H01L 31/105; H04B 10/27; H04B 10/272; H04B 10/60; H04B 10/66; H04B 10/69; H04B 10/691; H04B 10/693; H04B 10/6931; H04B 10/697
See application file for complete search history.

(56) References Cited

U.S. PATENT DOCUMENTS

| | | | | |
|---|---|---|---|---|
| 5,489,798 | A * | 2/1996 | Doguchi | H01L 31/022416 257/E27.128 |
| 5,557,117 | A * | 9/1996 | Matsuoka | H01L 29/0821 257/E29.189 |
| 5,684,308 | A * | 11/1997 | Lovejoy | H01L 27/1443 257/E27.128 |
| 5,689,122 | A | 11/1997 | Chandrasekhar | |
| 6,294,821 | B1 * | 9/2001 | Chandrasekhar | H01L 31/145 257/E27.122 |
| 6,727,530 | B1 * | 4/2004 | Feng | H01L 29/0821 257/E29.189 |
| 7,910,953 | B2 | 3/2011 | Nakaji | |
| 8,183,612 | B2 * | 5/2012 | Chong | H01L 31/1075 257/300 |
| 9,455,790 | B2 * | 9/2016 | Seo | H04B 10/6932 |
| 10,897,311 | B2 * | 1/2021 | Yu | G02F 1/015 |
| 12,087,871 | B2 * | 9/2024 | Wang | H01L 31/02363 |
| 2004/0033004 | A1 * | 2/2004 | Welch | H01S 5/04254 385/14 |
| 2008/0179496 | A1 | 7/2008 | Sakura et al. | |
| 2012/0141122 | A1 | 6/2012 | Carusone et al. | |
| 2019/0146151 | A1 | 5/2019 | Meister et al. | |
| 2022/0045767 | A1 * | 2/2022 | Li | H04B 10/27 |
| 2022/0232301 | A1 * | 7/2022 | Biederman | H04J 14/0282 |
| 2023/0019783 | A1 * | 1/2023 | Tarof | H01L 27/1443 |

OTHER PUBLICATIONS

K. Kiziloglu et al., "InP-based high sensitivity pin/HEMT/HBT monolithic integrated optoelectronic receiver," Conference Proceedings. 1998 International Conference on Indium Phosphide and Related Materials (Cat. No.98CH36129), Tsukuba, Japan, 1998, pp. 443-446; doi: 10.1109/ICIPRM. 1998.712506.

J. Caldwell, "Transimpedance Amplifiers: What Op Amp Bandwidth do I need"; 2014 https://e2e.ti.com/blogs_/b/precisionhub/archive/2014/05/07/transimpedance-amplifiers-what-op-amp-bandwidth-do-i-need-part-i.aspxDCMP=hpa-pa-opamp HQS=hpa-pa-opamp-fb-thehub-20140516-20140507-part1-en.

Burr-Brown Corporation, application bulletin 1994, "Noise Analysis of Fet Transimpedance Amplifiers".

K. W. Kobayashi, "State of the Art 60 GHZ, 3.6 K-Ohm transimpedance amplifier for 40 GB/s and beyond", IEEE Radio Frequency Integrated Circuits (RFIC) Symposium, 2003; Jun. 9-10, 2003; DOI: 10.1109/RFIC.2003.1213892.

J-Y Dupuy, et al., "59-dB? 68-GHz Variable Gain-Bandwidth Differential Linear TIA in 0.7-um InP DHBT for 400-GB/s Optical Communication Systems", 2015 IEEE Compound Semiconductor Integrated Circuit Symposium (CSICS), 2015, pp. 1-4, doi: 10.1109/CSICS.2015.7314463.

Maxim Integrated, Application Note: HFAN-3.2.0 Rev.1; 04/08- "Improving noise rejection of a PIN-TIA ROSA".

J. Brouckaert, et al., "Thin-Film II-Photodetectors Integarated on Silicon-on-Insulator Photonic ICs", J. Lightwave Technology, vol. 25, No. 4, Apr. 2007.

Allard Van Der Horst, "Technology to the rescue of next-generation 10G PON networks", LightWave Online, Apr. 1, 2010; (https://www.lightwaveonline.com/fttx/article/16649200/technology-to-the-rescue-of-neP/lxtgeneration-10g-pon-networks).

G. Royo, et al., "A highly linear low-noise transimpedance amplifier for indoor fiber-wireless remote antenna units", Electronics 2019, 8, 437; doi: 10.3390/electronics8040437.

Luis Orozco, et al., "Optimizing Precision Photodiode Sensor Circuit Design", Analog Devices Technical Article MS-2624, 2014 (www.analog.com).

C. L. F. Ma, et al., "Modelling of Breakdown Voltage and Its Temperature Dependence in Sagcm InP/InGaAs Avalanche Photodiodes" Proceedings of 1994 IEEE International Electron Devices Meeting, 1994, pp. 583-586, doi: 10.1109/IEDM.1994.383341.

GCS Preliminary Datasheet "56GBaud 1310nm/1550nm InGaAs PIN PD" DO480_16um_C3 NH www.gcsincorp.com downloaded Oct. 29, 2019.

GCS Preliminary Datasheet "56GBaud 1310nm/1550nm InGaAs PIN PD" DO480_16um_C3 www.gcsincorp.com downloaded Oct. 25, 2019.

B. Razavi, "The Transimpedance Amplifier", IEEE Solid-State Circuits Magazine, Winter 2019.

International Search Report issued on corresponding International Patent Application No. PCT/CA2020/051666 dated Feb. 15, 2021; 3 pages.

* cited by examiner

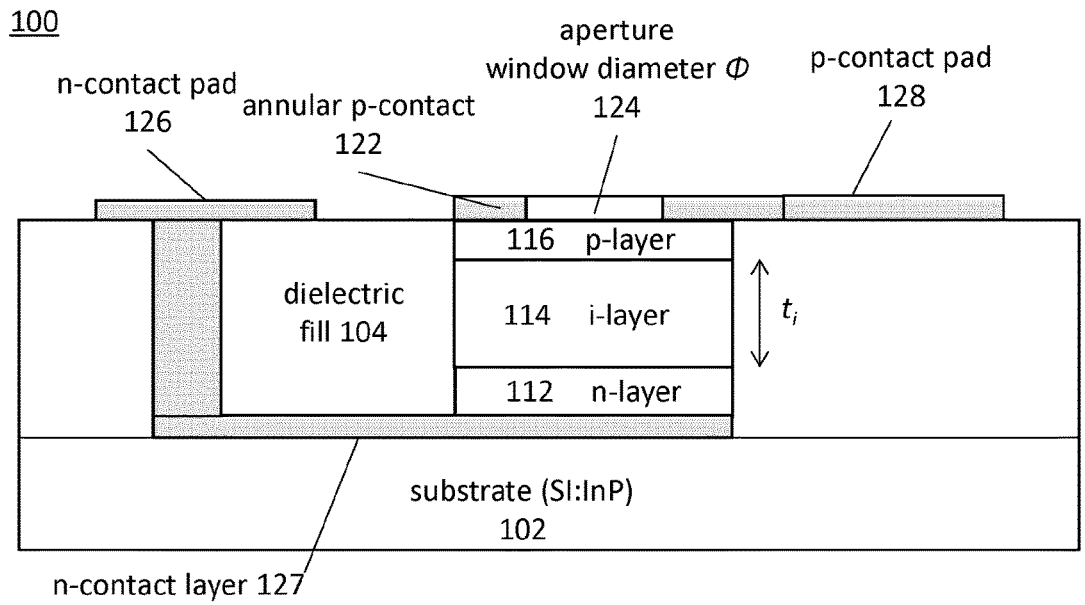
Fig. 4
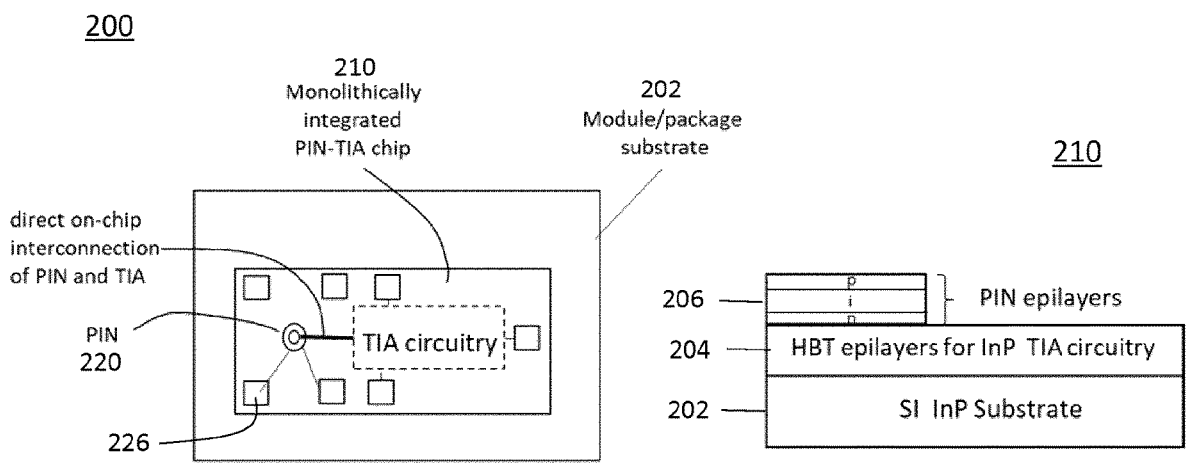
Monolithically integrated PIN-TIA module - topology schematic
Fig. 5A                    Fig. 5B

| f (GHz) | 25 | |
|---|---|---|
| | typical | max |
| single bondpad C (nF) | 1.4E-05 | 1.5E-05 |
| inductance limit (nH) | 2.98 | 2.74 |

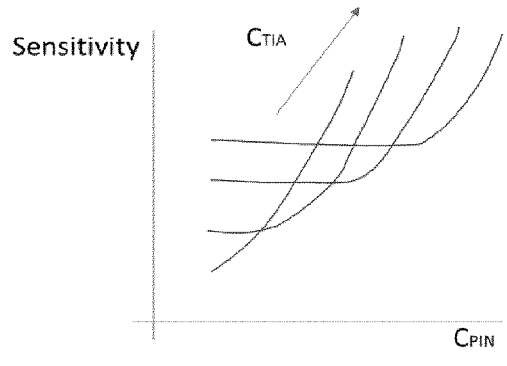
Fig. 7A
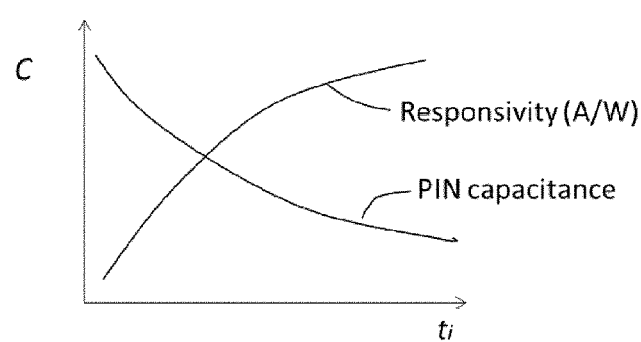
Fig. 7B
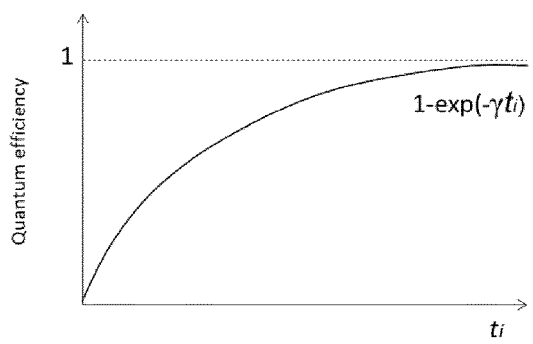
Fig. 9
$$C = \varepsilon A / t_i$$
$$f_{RC} = \frac{t_i}{2\pi R_F \varepsilon A}$$
$$f_{tr} = \frac{0.443\, V_{avg}}{t_i}$$
Fig. 8

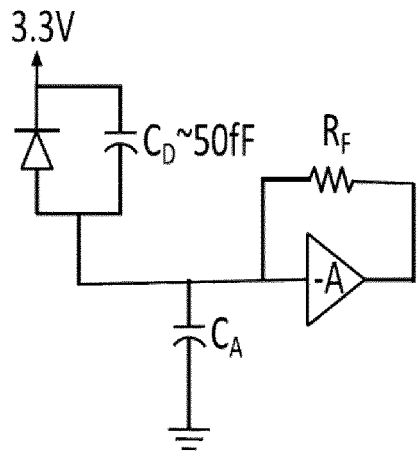

$$R_F \leq \frac{f_T}{2\pi(C_D + C_A)BW^2}$$

Fig. 13

Example: device specifications for integrated PIN –TIA

| Receiver input | Photo-detector specifications | | | | TIA specifications | |
|---|---|---|---|---|---|---|
| Sensitivity | Type | Wavelength | Responsivity | Input referred noise | Tz | BW |
| dBm |  | nm | A/W | nA | Ohm | GHz |
| -28<br>-30 | InGaAs PIN | 1577 | ≥0.7 | 400 | 1500 | 7.5 |

For InP HBT, assume $f_T \geq$ 100GHz
PIN diode capacitance 50fF
Input capacitance of TIA 50fF
Calculated $R_F$ = 1500Ω

Fig. 14

Circuit Schematic for Monolithically Integrated PIN-TIA

Simplified Equivalent Circuit of
Monolithically Integrated PIN-TIA

OPTICAL RECEIVER COMPRISING MONOLITHICALLY INTEGRATED PHOTODIODE AND TRANSIMPEDANCE AMPLIFIER

CROSS-REFERENCE TO RELATED APPLICATION(S)

This application claims priority from U.S. provisional patent application No. 62/950,479 filed Dec. 19, 2019, which is incorporated by reference in its entirety.

TECHNICAL FIELD

The present invention relates to optical receivers comprising a photodiode detector and a transimpedance amplifier (TIA), for applications such as gigabit-capable passive optical networks (GPON).

BACKGROUND

A passive optical network (PON) is a point-to-multipoint, fiber to the premises network architecture. PON networks use passive splitters and combiners to distribute optical signals, without requiring active elements such as optical amplifiers. An optical line terminal (OLT) at the central office of the service provider communicates with optical network units (ONUs) at each customer premise. The ONU comprises an optical receiver for converting the received optical signal to an electrical output.

For example, 10Gigabit-capable PON may be referred to as 10G-PON or XG-PON. Recommendation ITU-T G.987 is a family of documents that define this access network standard. Simultaneous upstream and downstream transmission over the same fiber is made possible through wavelength division multiplexing (WDM). This technology allows one PON wavelength transmission for upstream and another for downstream. For example, 10G-PON uses 1577 nm for downstream and 1270 nm for upstream.

The optical receiver of the ONU comprises a photodiode detector and a transimpedance amplifier. The optical receiver performance is dependent on several factors, e.g.:
  Photo-diode optical and electrical performance such as responsivity, carrier transit time, and RC electrical characteristics;
  Transimpedance amplifier semiconductor performance such as gain, noise, overload and bandwidth;
  Hybrid integration parasitics and packaging parasitics, such as series input inductance and stray capacitance.

The photodiode technology sets the physical limit on sensitivity and bandwidth performance in the receiver. The choice of TIA technology and design approach strongly determines the overall receiver performance.

For 10G PON, optical receivers for 1577 nm typically use a hybrid arrangement of an avalanche photodiode (APD) and a transimpedance amplifier (TIA), i.e. discrete components. At present, commercially available semiconductor lasers emitting in the 1577 nm wavelength range have limited output power and InGaAs pin photodiodes (pin PD) do not have sufficient sensitivity to be used as ONU optical detectors for 1577 nm (1575-1581 nm). Thus, it is necessary to use more expensive APD to obtain the required performance, e.g. responsivity and sensitivity. Apart from higher cost, other drawbacks of APD are the need for a high voltage supply, extra circuitry for the control loop, poor reliability at longer lifetimes, or limited operational lifetime.

Receiver sensitivity is defined as the signal optical power required at the receiver to achieve the targeted bit error rate (BER). For 10G PON, per ITU-T G.987, the required sensitivity of −28.5 dBm, to achieve a BER of $10^{-3}$, or better, is out of reach of available InGaAs vertical pin photodiodes. An APD can exceed the sensitivity of a discrete pin PD, e.g. by 3 to 5 dB, such that an APD has enough sensitivity for this application.

On the other hand, performance of an optical receiver comprising a hybrid integrated photodiode (PD or APD) and TIA, is limited by parasitics, e.g. pad capacitances, inductances of wire bonds, and the need for impedance matching of the interconnect between the APD and TIA. These issues are of a particular concern as data rates are increased from 10 Gb/s to 25 Gb/s and 50 Gb/s, and beyond.

Thus, there is a need for optical receivers comprising photodiode detectors for 10G-PON and next generation PON, e.g. 1577 nm photodiode detectors for ONU, or 1270 nm photodiode detectors for OLT, which provide one or more of performance improvements, cost reduction, or alternative solutions to replace conventional hybrid APD-TIA modules.

SUMMARY OF INVENTION

The present invention seeks to eliminate or mitigate one or more of the above-mentioned disadvantages of known devices and systems comprising hybrid photodiode detectors and TIA, or at least provide an alternative.

Aspects of the invention provide optical receivers comprising a monolithically integrated photodiode and transimpedance amplifier and methods of optimizing performance of monolithically integrated photodiodes and transimpedance amplifier to meet performance specifications, e.g. for next generation PON.

In one aspect, an optical receiver comprises a monolithically integrated photodiode (PD) and transimpedance amplifier (TIA), wherein:
the TIA comprises InP heterojunction bipolar transistors (HBT) formed by a first plurality of layers of an epitaxial layer stack grown on a SI (semi-insulating) InP substrate;
the PD comprises a pin diode (PIN) formed by a second plurality of semiconductor layers of the epitaxial layer stack comprising an n-layer, an i-layer and a p-layer;
a p-contact of the PIN diode is directly interconnected by a conductive trace to an input of the TIA to reduce a device capacitance $C_{PIN}$ of the PIN, and the input capacitance of the TIA is $C_{TIA}$; and
device parameters comprising values of: $C_{PIN}$, $C_{TIA}$, an area A or window diameter ($\Phi$) of the PIN, a thickness $t_i$ of the i-layer of the PIN, and a transimpedance feedback resistance $R_F$ of the TIA are selected to provide an integrated PIN-TIA meeting performance specifications comprising a specified sensitivity and responsivity at an operational wavelength.

For example, said device parameters are selected by an optimization process to provide an integrated PIN-TIA meeting said required performance specifications, e.g. sensitivity, responsivity, bandwidth, transimpedance gain, et al. In some embodiments, $C_{PIN}$ is matched to $C_{TIA}$.

In example embodiments, e.g. for an operational wavelength for 10G PON, the i-layer (i.e. the absorption layer) of the PIN comprises InGaAs. In other embodiments, instead of the PIN comprising an i-layer of InGaAs, other absorption materials within the InGaAlAsP penternary system, lattice matched to InP can be used. The i-layer, or absorption layer, may comprise a single layer or a multi-layer structure. The n-layer and p-layer may be n-doped InP and p-doped InP, or any other suitable lattice matched semiconductor materials. Each of the n-layer and p-layer may also comprise a single layer or multi-layer structure.

Notably, when the PIN diode is directly interconnected by a lithographically defined conductive trace to an input of the TIA, parasitic capacitances and inductances of bond pads and bond-wires required for hybrid integration of a PD and a TIA are eliminated. Also, a lithographically defined interconnect trace between the PIN diode and TIA provides a more well-defined and reproducible interconnection, which avoids issues of variability and inconsistency of wire-bonded interconnections of hybrid components.

For example, using this design methodology, a monolithically integrated PIN-TIA may be fabricated with a sensitivity and responsivity that meets performance specifications for receiver for 10G PON, either a 1577 nm receiver of an Optical Network Unit (ONU) or a 1270 nm receiver of an Optical Line Terminal (OLT) for 10G PON. An InGaAs PIN is well suited to operation at these wavelengths. That is, a monolithically integrated InGaAs PIN-TIA may be configured to have a sensitivity and responsivity of e.g. better than −28 dBm, or better than −30 dBm, i.e. comparable to a conventional hybrid APD-TIA for a 1577 nm ONU receiver. In an initial prototype, a responsivity~0.7 A/W at 1550 nm was achieved. By further optimizing the PIN-TIA parameters, as described herein, it is expected that, for example, at 1577 nm, a responsivity of e.g., ≥0.8 A/W, or ≥0.9 A/W or ≥1.0 A/W, i.e. approaching a quantum efficiency limit of 1.28 A/W, can be achieved.

In some embodiments, the Quantum Efficiency (QE) is improved by including a mirror (i.e. optical reflector), i.e. to create a dual pass through the thickness $t_i$ of the i-layer. For example, the mirror comprises a multilayer quarter wave stack of alternating high index (e.g. semiconductor) and low index (e.g. dielectric) lattice matched materials to create the dual pass through the i-layer, in effect providing an absorption length in the i-layer of two times $t_i$ n-layers of the mirror acts as the n-layer of the PIN. In some embodiments, the Quantum Efficiency may be ≥85% or ≥90%.

In some embodiments, to reduce optical losses, the window or aperture comprises an anti-reflection coating optimized for the operational wavelength, and the p+ cap layer is selected to be substantially transparent at the operational wavelength, e.g. the p+ cap layer made thinner and made of a material that reduces optical losses, rather than minimizing sheet resistance and contact resistance for the p-contact.

In an example embodiment of an optical receiver comprising a monolithically integrated PIN-TIA for operation at 1577 nm, the HBTs are characterized by $f_T \geq 100$ GHz, the TIA has a bandwidth (BW) of 7.5 GHz, $C_{PIN}$ is ≤50 fF, $C_{TIA}$ is <50 fF and $R_F$=1500Ω. In another embodiment, a $C_{PIN}$ of 14 fF has been achieved. Beneficially, to increase sensitivity, the combined capacitance ($C_{PIN}+C_{TIA}$) is minimized, and $C_{TIA}$ is designed to be close to $C_{PIN}$, or matched to $C_{PIN}$. For example, for improved sensitivity, if $C_{PIN}$ can be reduced sufficiently by design of the PIN, it may be desirable to use shorter gate length InP HBTs for the TIA, i.e. for reduced $C_{TIA}$. On the other hand, if reducing $C_{PIN}$ is a limiting factor, it may be sufficient to select a $C_{TIA}$ which is matched to $C_{PIN}$, and use lower cost fabrication, i.e. the monolithically integrated PIN-TIA may be implemented using cheaper, larger gate length technology for fabrication of InP HBT circuitry of the TIA. For example, if $C_{PIN}$ is ~50 fF, or ~30 fF, $C_{TIA}$ may be selected to be matched to $C_{PIN}$. If $C_{PIN}$ is reduced to ≤30 fF, or ≤15 fF, then smaller gate width HBTs may be used to reduce $C_{TIA}$.

In some embodiments, an optical receiver for an OLT (Optical Line Terminal) or ONU (Optical Network Unit) of a 10G Passive Optical Network (PON) comprises: a monolithically integrated photodiode (PD) and a transimpedance amplifier (TIA), wherein:
the TIA comprises InP (indium phosphide) heterojunction bipolar transistors (HBT) formed by a first plurality of layers of an epitaxial layer stack grown on a SI (semi-insulating) InP substrate;
the PD comprises a pin diode (PIN) formed by a second plurality of semiconductor layers of the epitaxial layer stack comprising an n-layer, an i-layer and a p-layer;
a p-contact of the PIN diode is directly interconnected by a conductive trace to an input of the TIA; and
the i-layer comprises absorption material selected for an operational wavelength of the OLT or the ONU.

For an optical receiver of an ONU, the i-layer comprises a single layer or a multi-layer structure comprising material that absorbs at 1577 nm. For an optical receiver of an OLT, the i-layer comprises a single layer or a multi-layer structure comprising material that absorbs at 1270 nm. For example, the i-layer is selected from the group comprising InGaAs and other absorption materials of the InGaAlAsP materials system, which are lattice matched to InP. Where the PIN has circular geometry, i.e. for normal incidence, the PIN may comprise a mirror (optical reflector) underlying the i-layer, to create a dual-pass through the i-layer.

While example embodiments of monolithically integrated PIN-TIA are described with reference to implementation using an InGaAs PIN and TIA circuitry fabricated with InP HBTs, the design methodology may be extended to other forms of PD implemented using InGaAs/InP process technology, for example, where the PD is an APD or a waveguide PIN (lateral facet window) instead of a vertical PIN (top facet window). Design parameters of the latter may be optimized to provide an integrated PD-TIA meeting performance specifications for an optical receiver of an ONU or OLT for 10G PON, or for other applications requiring high data rate optical detectors.

For example, other applications may include, 5G and database technology, although the wavelengths of operation may be somewhat different from PON.

More generally, another aspect of the invention provides an optical receiver comprising a monolithically integrated photodiode (PD) and transimpedance amplifier (TIA), wherein:
the TIA comprises heterojunction bipolar transistors (HBTs) formed by a first plurality of layers of an epitaxial layer stack formed on a substrate;
the PD is formed by a second plurality of semiconductor layers of an epitaxial layer stack;
a p-contact of the PD is directly interconnected by a conductive trace to an input of the TIA to provide a capacitance $C_{PD}$ of the PD, and a capacitance $C_{TIA}$ of the TIA; and
device parameters comprising said $C_{TIA}$ and $C_{PD}$; a thickness $t_i$ of an absorption layer of the PD; a window diameter Φ or area A of the PIN; and a transimpedance feedback resistance $R_F$ of the TIA; are selected to provide an integrated PD-TIA meeting device specifications comprising a specified sensitivity and responsivity at an operational wavelength.

For example, the PD may be one of: a pin PD; an avalanche PD; a waveguide pin PD; a waveguide pin PD with travelling-wave geometry; a uni-travelling carrier (UTC) PD, a resonance enhanced cavity PD; a SAGCM APD; a superlattice APD; and other suitable types of photodiode.

Where appropriate, the PD may comprise a mirror (optical reflector) configured to create a dual-pass through the absorption layer, e.g. a multi-layer quarter-wave stack of alternating high index and low index lattice-matched materials. For example, device parameters comprise a mirror thickness $t_m$ of the multi-layer quarter wave stack, and a thickness $t_i$ of the absorption layer, wherein $t_i$ and $t_m$ are selected to obtain a required Quantum Efficiency, e.g. ≥85% or ≥90%

For improved performance, values of $C_{PIN}$ and $C_{TIA}$ provide at least one of: a) $C_{PIN}$ is matched to $C_{TIA}$; b) $C_{PIN}$ is approximately equal to $C_{TIA}$; and c) a minimum combined capacitance ($C_{PIN}+C_{TIA}$).

In example embodiments, the device parameters of the monolithically integrated PD-TIA are optimized to provide a specified sensitivity and responsivity meeting performance specifications for a receiver for a high speed data application, such as a receiver for Optical Network Unit (ONU) for 10G PON or a receiver for an Optical Line Terminal (OLT) for 10G PON.

Elements of monolithically integrated PIN-TIA and PIN-PD of example embodiments may be combined with elements of other embodiments, where appropriate. For example, monolithically integrated PIN-TIA and PD-TIA of other embodiments may comprise any feasible combination of individual features disclosed herein.

Another aspect of the invention provides a method of fabrication of device structures, comprising monolithically integrated PIN-TIA and PD-TIA for optical receivers as disclosed herein.

The foregoing and other objects, features, aspects and advantages of the present invention will become more apparent from the following detailed description, taken in conjunction with the accompanying drawings, of some embodiments of the invention, which description is by way of example only.

BRIEF DESCRIPTION OF THE DRAWINGS

FIG. 4 shows a schematic cross-sectional view through layers of an example InGaAs pin PD to show design parameters comprising window diameter Φ and i-layer thickness $t_i$;

FIG. 5A shows a schematic topology view (top plan view) of a monolithically integrated PIN-TIA of an example embodiment;

FIG. 5B shows a schematic cross-sectional view of an epitaxial layer structure for fabrication of the monolithically integrated PIN and a TIA of the example embodiment;

FIG. 7A shows a schematic plot to illustrate dependence of sensitivity on PIN device capacitance $C_{PIN}$ and TIA capacitance $C_{TIA}$;

FIG. 7B shows a schematic plot to illustrate dependence of PIN device capacitance $C_{PIN}$ and responsivity (A/W) and on the i-layer thickness $t_i$;

FIG. 8 lists some equations showing relationships between the device parameters;

FIG. 9 shows a schematic plot to illustrate dependence of Quantum Efficiency on the i-layer thickness $t_i$;

FIG. 13 shows a simplified equivalent circuit schematic for the PIN and TIA to illustrate key parameters for design of the monolithically integrated PIN-TIA design of the example embodiment;

FIG. 14 is a table with example device specifications for the monolithically integrated PIN-TIA of the example embodiment;

DETAILED DESCRIPTION

Figure 1:
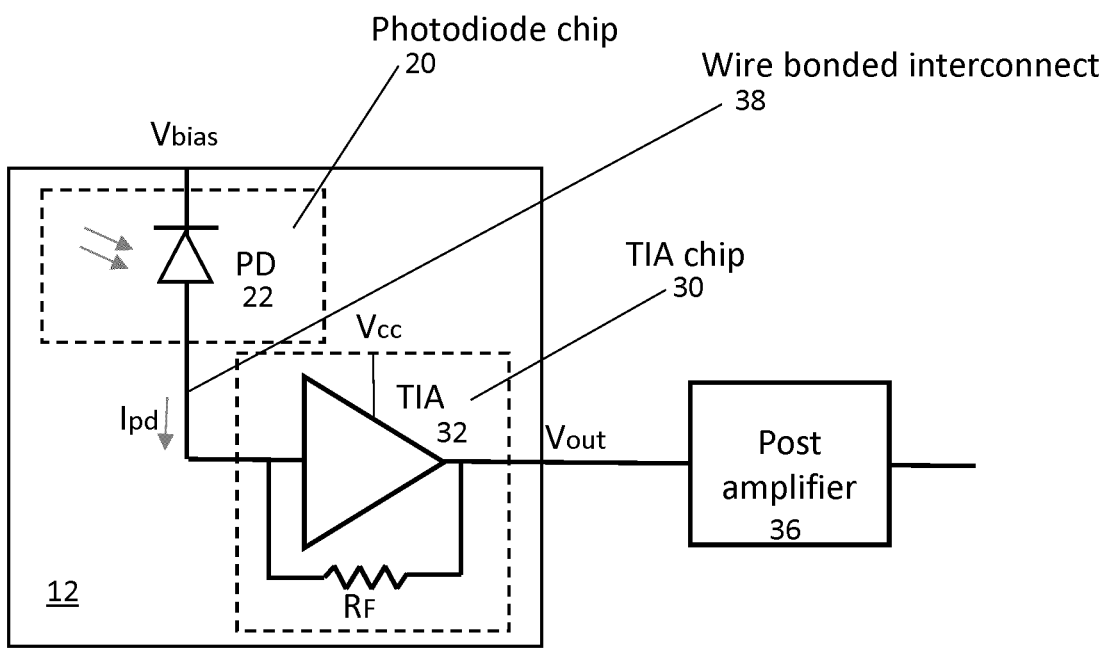
FIG. 1 (Prior Art) shows a schematic functional block diagram of an optical receiver comprising a hybrid photodiode detector PD and a TIA.

A schematic functional block diagram of an optical receiver comprising a hybrid assembly 10 of a package substrate 12, a photodiode chip 20 comprising a photodiode (PD) 22 and a TIA chip 30 comprising a TIA 32 with feedback resistor $R_F$, and a discrete post amplifier 36, is shown in FIG. 1. The photodiode chip 20 is interconnected to the TIA chip 30 with wirebonded interconnect 38, to feed photocurrent $I_{PD}$ to the TIA 322 to generate output voltage $V_{out}$. The photodiode PD may be an APD, or a pin PD (PIN), or other type of photodiode, depending on the required performance specifications. Typically, for GPON and 10GPON, to provide the required sensitivity, e.g. better than −28.5 dBm, the photodiode is an APD. As mentioned in the background section, it would be desirable to replace a hybrid APD-TIA with a lower cost monolithically integrated PIN-TIA with comparable performance and sensitivity.

Conventional wire bonded interconnections of a hybrid PIN-TIA optical receiver add significant parasitics, which limit performance of a PIN-TIA. In particular, the bond pads add capacitance and bond-wires add inductance. It will also be appreciated that the consistency of wire-bonded interconnections of hybrid components tend to be dependent on the type of packaging used, and in practice, some variability or inconsistencies in wire-bonded interconnections for individual optical receiver units may be expected. These variabilities or inconsistencies in wire-bonding lead to corresponding variabilities or inconsistencies in parasitic capacitances and inductances of hybrid PIN-TIA.

Monolithically integrated PIN-TIA of embodiments of the present invention are disclosed, which offer an alternative to conventional hybrid APD-TIA for 10G-PON, with at least comparable performance, and potentially offer performance improvements and/or cost reductions relative to other hybrid PD-TIA.

Figure 2:
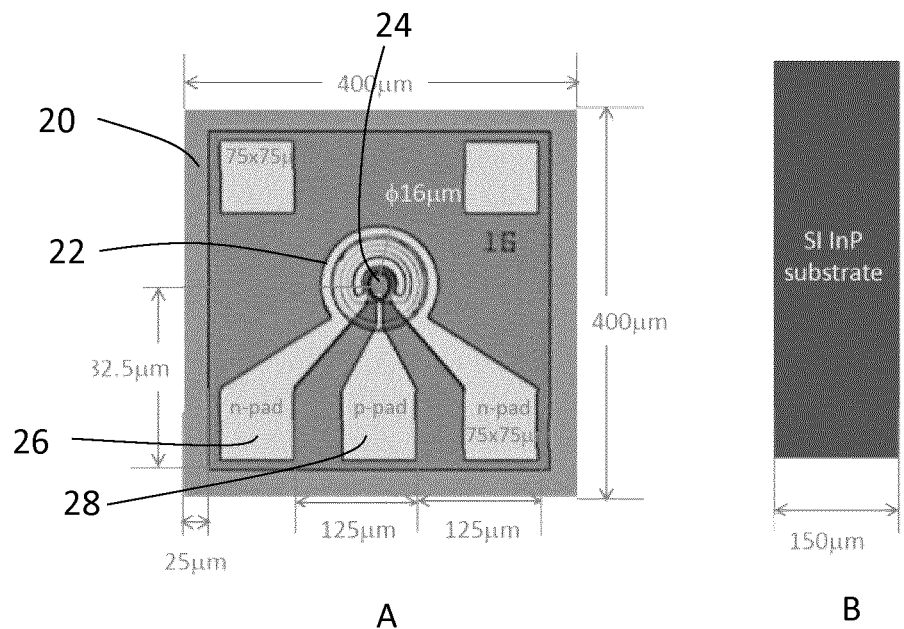
FIG. 2 shows two views of an example of a commercially available InGaAs pin PD.

An example top view A and side view B of a photodiode chip 20 comprising a 56 Gb/s InGaAs PIN 22 (GCS DO480_16 um_C3), which is suitable for a high speed optical receiver operating at 1577 nm, is shown in FIG. 2. The device has an optical window 24 of 16 µm diameter, and is reported to have a 36-40 GHz 3 dB bandwidth when operated with an optimized TIA. In a conventional hybrid arrangement of a PIN and a TIA, e.g. as shown in FIG. 1, two bond pads, i.e. an n-pad 26 and a p-pad 28, e.g. 75 µm 50Ω pads, are required to connect the PD to the TIA with wire bonds. Both pads of the PD add capacitance, which can be a significant fraction of the total capacitance of the device. The product datasheet reports a device capacitance in a range of 65 nF to 80 nF.

Figure 3:
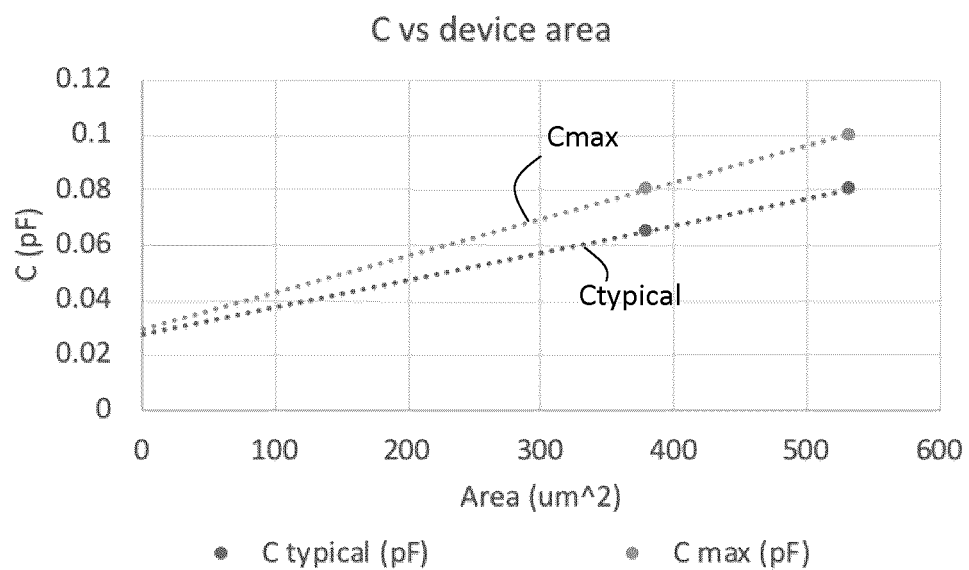
FIG. 3 shows an example plot of device capacitance vs. device area for pin PDs of different device areas.

Taking some example InGaAs PIN devices of different areas, which have publicly available datasheets, and working backwards from information on the datasheets, it is estimated that the parasitic capacitance of the bond pads contributes roughly half of the total device capacitance. This estimate is derived, as illustrated schematically in the plot of capacitance C (pF) vs. device area (µm$^2$) in FIG. 3, by extrapolation to zero device area based on typical capacitance and maximum capacitance data for devices of different device areas.

FIG. 4 shows a schematic cross-sectional view of an InGaAs PIN device structure 100 showing the p-i-n layer structure 110 comprising an n-layer 112, an i-layer 114 and a p-layer 116 formed on a semi-insulating (SI) indium phosphide (InP) substrate 102. The i-layer has a thickness $t_i$. An annular p-contact 122 is formed on the p-layer with an optical aperture or window 124 having a diameter Φ. Bond pads comprise a p-contact pad 126 and a n-contact pad 128. The annular p-contact 122 extends to the p-contact pad 128. The n-layer 112 is formed on an n-contact layer 127, which is interconnected, e.g. by a conductive via through the dielectric layer 104, to the n-contact pad 126. The capacitance $C_{PIN}$ of the p-i-n junction itself is necessary for device operation. For a given device aperture window diameter Φ, if the junction capacitance were zero, the transit time would be infinite, and the bandwidth would be zero. A finite junction capacitance is necessary to balance off RC with carrier transit time. However, the bond pad capacitance adds no useful functionality, and ideally the bond pad capacitance would be zero.

Monolithic integration of the PIN and TIA eliminates the bond pad capacitance, and bond wire inductance, by design. For example, it is possible to integrate a InGaAs PIN with a TIA fabricated using InP heterojunction bipolar transistors (HBTs). This means there is a direct on-chip interconnection, i.e. a lithographically defined conductive trace, from the output of the PIN to the input of the TIA. Preferably the conductive trace between the PIN and TIA provides a short, low resistance, low inductance interconnection, eliminating the need for impedance matching. Thus, one of the 50Ω bond pads of the PIN is eliminated because there is a direct interconnection, instead of not a wire bond connection between the PIN and TIA. Since the conductive trace providing the direct interconnection between the PIN and TIA is lithographically defined, i.e. using one or more interconnect metallization layers, the PIN-TIA interconnection is more reproducibly and consistently defined, for each PIN-TIA on a wafer, and from wafer-to-wafer, and from batch-to-batch.

A schematic device topology (top plan view) for a monolithically integrated PIN-TIA of an example embodiment 200 is shown in FIG. 5A. The monolithically integrated PIN-TIA chip 210 comprises a PIN device structure 220 and TIA circuitry 230. There is a direct on-chip interconnection 240 between the p-contact of the PIN 220 and the TIA circuitry. A schematic cross-sectional view of the monolithically integrated PIN-TIA chip 210 comprising a substrate 202 is shown in FIG. 5B, to illustrate monolithic integration of HBT epitaxial layers 204 for the TIA and overlying epitaxial layers 206 to form the PIN is shown in FIG. 5B. Although the opposite terminal of the PIN is coupled to a bond pad (i.e. a ground pad), the capacitance of this pad is actually decoupled from device operation. Since the output of the PIN is directly coupled to a first stage amplifier of the TIA by a conductive trace providing a direct on-chip interconnection, in effect, the pad capacitance of the PIN does not figure into device operation. This has multiple useful consequences.

Figures 6A, 6B:
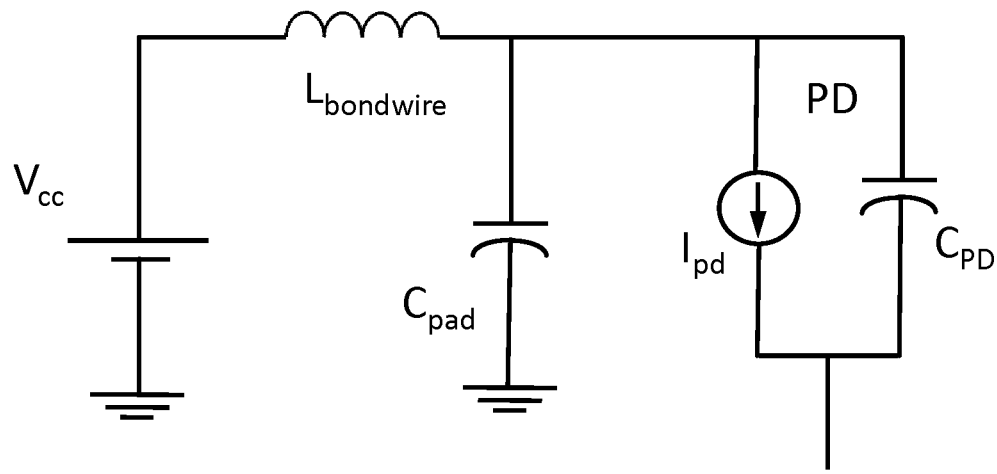
FIG. 6A shows a simplified equivalent circuit schematic for the PIN of a monolithically integrated PIN-TIA and FIG. 6B is a table listing some parameters.

It is estimated that eliminating these parasitic capacitances would extend the RC-limited bandwidth by roughly a factor of 2. Monolithic integration of the PIN and TIA eliminates the bond pad of the PIN terminal connected to the TIA, which removes one of two bond pads, i.e. reduces the bond pad capacitance by half. Referring to the equivalent circuit diagram shown in FIG. 6A, the PIN is modelled as a device current source $I_{PD}$ and device capacitance $C_{PIN}$, with pad capacitance $C_{PAD}$ in series with a wirebond inductance $L_{Bondwire}$. The effect of this circuit is LC limited. For a 25 GHz LC limit ($f=\frac{1}{2}\pi(LC)^{1/2}$), this limit is roughly 2 nH (see table in FIG. 6B). The inductance of a typical gold wirebond, 1 mm in length is roughly 0.8 nH at 10 GHz or 25 GHz (i.e. 0.8 nH/mm). So, for all practical purposes, this LC limit is well beyond any important circuit considerations for this application, or up to 25 GHz. At 50 GHz, the inductance would need to be managed, e.g. by using multiple wirebonds, low inductance conductive interconnect tracks, or other techniques designed to reduce inductance. By elimination of the wirebond connection between the PIN to the TIA, the bond pad inductance for the remaining bond pad is half the inductance of a hybrid arrangement with two bond pads. Monolithic integration of the PIN-TIA reduces both parasitic device capacitance and inductance.

For example, more generally, assuming the capacitance of a single bond pad is approximately 15 fF, the inductance peak for 25 GHz is at 2.7 GHz, provided the bond wire is shorter than 3 mm or so, the resonance would be at a higher bandwidth than 25 GHz, and inconsequential for 10 GHz.

The frequency response of a pin PD is limited primarily by RC and transit time in parallel, i.e. the sum of squares of the associated response times. If the PIN capacitance $C_{PIN}$ is halved, this gives a higher bandwidth, or, for the original bandwidth, additional degrees of freedom to increase the thickness $t_i$ of the i-layer of the pin PD are available. Although a thicker i-layer increases the carrier transit time, which typically would not be desirable, a lower device capacitance $C_{PIN}$ allows a trade-off, because a thicker i-layer increases the responsivity, which is beneficial. This trade-off permits, for a given bandwidth, a higher responsivity for a circular geometry (i.e. normal incidence) PIN than would otherwise be the case.

Some schematic graphical representations of the interdependence of device parameters are shown in FIGS. 7A, 7B and FIGS. 9 to 12. The PIN-TIA sensitivity can be improved by reducing the capacitance of the PIN and reducing the capacitance of the TIA, as shown schematically in the plots of FIG. 7A. For example, referring to the equations shown in FIG. 8, as illustrated schematically in the plot shown in FIG. 7B, the capacitance of the PIN decreases with the thickness of $t_i$, and the responsivity, in A/W, increases with thickness $t_i$, The quantum efficiency of the PIN also increases with an exponential dependence on $(1-\gamma t_i)$, as shown schematically in FIG. 9.

To provide improved performance, first, the effective device capacitance $(C_{PIN}+C_{TIA})$ is lowered by monolithic integration, i.e. by removing a bond pad and providing a direct interconnect between the PIN and TIA; and second, the device thickness $t_i$ is increased. The overall f_3 dB envelope of the PIN vs. device thickness is improved, as illustrated by the data shown in FIG. 10. These combined effects provide improved bandwidth for a PIN of a given diameter.

Figure 10:
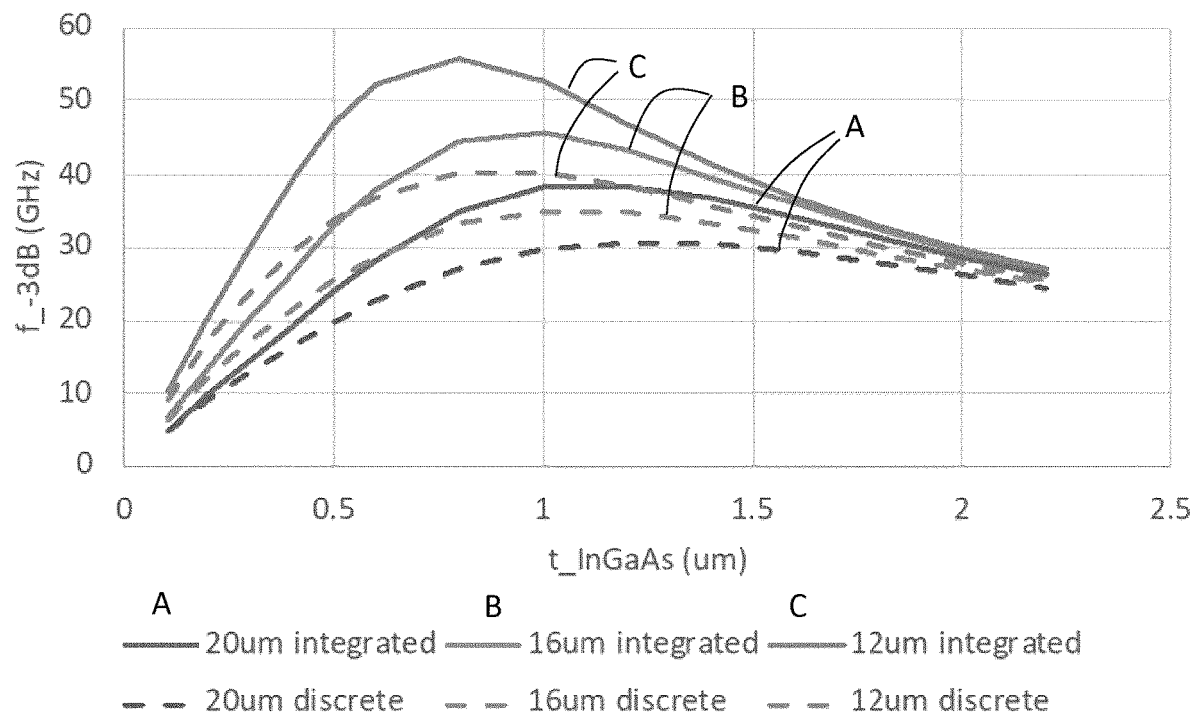
FIG. 10 shows a plot of computed data, based on a simplified model, for the −3 dB bandwidth f_−3 dB(GHz) as a function of the i-layer thickness $t_i$ (μm) (labelled in the graph as t_InGaAs(um)) for hybrid PD-TIA (discrete) and integrated PIN-TIA (integrated) having three different aperture diameters.
Figure 11:
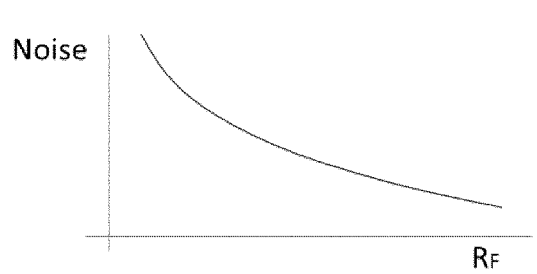
FIG. 11 shows a schematic plot to illustrate dependence of noise on the feedback resistance $R_F$ of the TIA.
Figure 12:
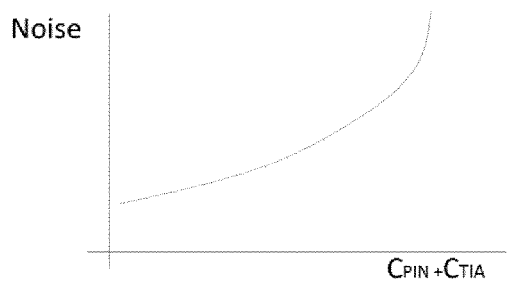
FIG. 12 shows a schematic plot to illustrate dependence of noise on the combined device capacitance of the PIN and capacitance of the TIA ($C_{PIN}+C_{TIA}$)

The 3 dB bandwidth (f_3 dB) is given by the sum of squares of the transit time limited response and the RC response. The plot shown in FIG. 10 is for generic pin PD structures, with certain assumptions about bond pad capacitance (approximately 30 fF), annular contact area (3 μm was used for this calculation), literature values for hole and electron velocity (which are approximate, perhaps within ±20%), and using the approximation that all holes and electrons originate from the average absorption location within a circular, i.e. normal incidence, pin photodiode. The diameters referenced in the plot refer to open optical aperture for coupling to an optical fiber, with some additional surrounding area for the annular metal contact. For the data shown in FIG. 10, f_3 dB has been calculated some examples of monolithically integrated PIN-TIA (labelled "integrated") and hybrid PIN-TIA (labelled "discrete"), for pin PD having diameters of 20 μm, 16 μm and 12 μm diameter, using publicly available data, to extrapolate the bond pad capacitance.

Simplified Model for Transit Limit Derivation

In a simplified model for transit limit derivation the average absorption position was calculated for each InGaAs thickness $t_i$ and both carriers are assumed to be originating from this position.

The transit time limited bandwidth $f_{tr}$ is given by:

$$f_{tr} * t_i = 0.443 \quad (1)$$

where $t_i$ is the transit time of the intrinsic depletion layer of the InGaAs and a rectangular pulse single transit time approximation is assumed, leading to sinc(x) Fourier transform distribution. Let the transit direction be z, and let the thickness of the InGaAs be $z_i$ and the velocity assumed constant at $v_i$. Simple rearrangement of equation (1) gives:

$$z_i = \frac{0.443 * v_i}{f_{tr}} \quad (2)$$

Equation (2) also gives the transit time limited thickness for a given frequency. Lecture notes and textbooks usually assume the sum of squares of electron and hole transit times, but also do extensive numerical work. In this work, it is elected to assume all carriers originate from the average absorption location to calculate the transit time, and the two transit times are averaged, so as to arrive at an algebraically understandable result which is a close approximation. Also, the absorption profile is given by Beer's Law as exp $(-\gamma z)$, where $\gamma$ is the absorption coefficient. For light entering a normal-incidence geometry PD through the p-region, the average absorption location for electrons (which traverse to the p-contact) is given by:

$$z_{e,avg} = \frac{\int_0^{z_i} e^{-\gamma z} dz}{z_i} \quad (3)$$

which works out to:

$$z_{e,avg} = \frac{1 - e^{-\gamma z_i}}{\gamma z_i} \quad (4)$$

and, therefore the average absorption for holes is given by $$z_{h,avg} = z_i - z_{e,avg} \quad (5)$$

Often these quantities are calculated numerically. These closed-form, approximate expressions are useful for simplified calculations.

Based on these assumptions, this simplified model provides for comparison of the f_−3 dB bandwidth of some examples of monolithically integrated PIN-TIA and hybrid PIN-TIA. While a more sophisticated modelling approach could be taken, the basic physics would remain the same.

Referring to the data in FIG. 10, the following observations are made:

For the integrated set and for the discrete set, decreasing the diameter improves the frequency response at all values of t_InGaAs;

For any given diameter, going from discrete (with bond pad capacitance) to integrated (no bond pad capacitance) improves the frequency response at all values of t_InGaAs;

There is an optimum (i.e. peak) bandwidth for any given pin PD diameter, whether for integrated or discrete;

This optimum (peak) is sharper for integrated because higher bandwidths are possible, limited only by the device size;

For sufficiently thick t_InGaAs ($t_i$), the value of decreasing the diameter is diminishing; but for greater thicknesses, there is still a clear, yet small, advantage in bandwidth in the integrated approach.

Considering these data, for example, if more bandwidth were needed, the device thickness could be reduced, giving back the capacitance to obtain improved transit time. Or, if more responsivity were needed, the device thickness could be increased, worsening the transit time frequency response, with some room to give, because of the decreased capacitance. If the i-InGaAs layer is thinned for optimum bandwidth, the responsivity would decrease. To achieve both increased bandwidth and increased responsivity (QE) together, a mirror or reflector can be added to the PD, to allow for two-passes of absorbed light, i.e. to increase the effective thickness of the InGaAs i-layer, as will be described below.

Next, the input referred noise (IRN) and the receiver sensitivity achievable is improved by monolithic integration of the PIN and TIA, because the first stage amplifier (TIA) can accommodate a higher transimpedance feedback resistance $R_F$. That is, the TIA noise is inversely dependent on $R_F$, as shown schematically in FIG. 11. Conversely, noise increases with the combined capacitance of the PIN and TIA, i.e. $C_{PIN}+C_{TIA}$, as shown schematically in FIG. 12, e.g. because higher device capacitance limits the feedback resistance $R_F$.

FIG. 13 shows a simplified equivalent circuit schematic for the PIN and TIA to illustrate key parameters for a monolithically integrated PIN-TIA design, e.g. for an example device specification shown in the table in FIG. 14.

Putting together these two effects, i.e. reducing the PIN device capacitance, and increasing the value of the transimpedance feedback resistor $R_F$, which reduces TIA noise, results in improved sensitivity. Thus, it becomes possible to design a PIN-TIA having improved sensitivity, e.g. better than −28 dBm at 1577 nm, to meet the requirements for an optical receiver for 10G-PON.

Figure 15:
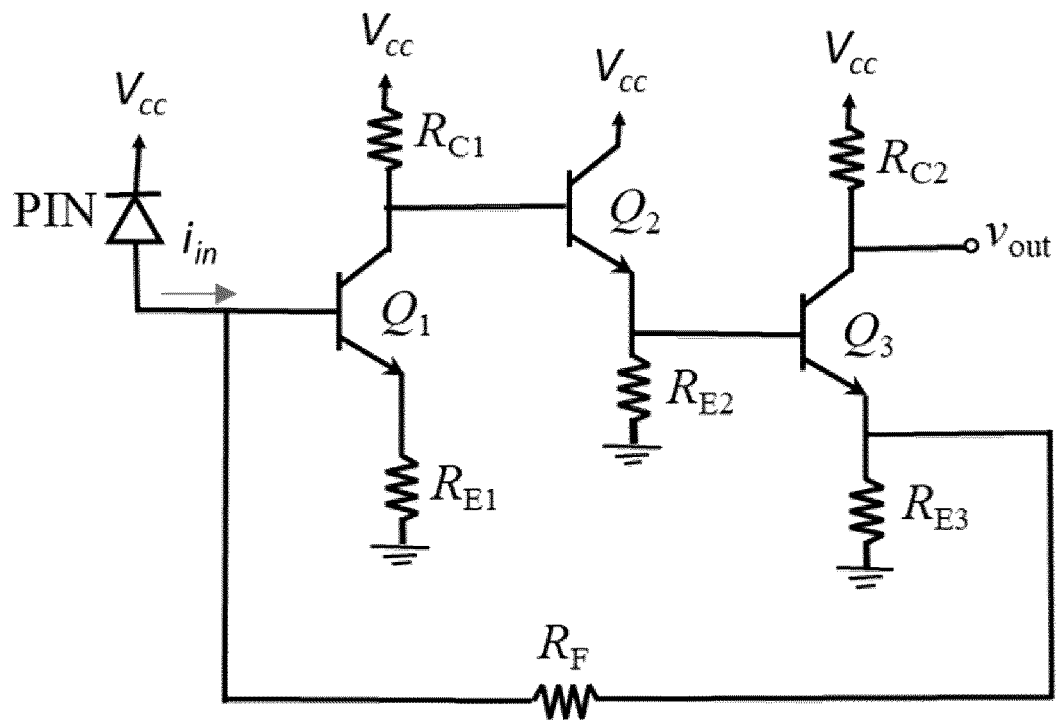
FIG. 15 shows a circuit design schematic for the monolithically integrated PIN-TIA of the example embodiment.
Figure 16:
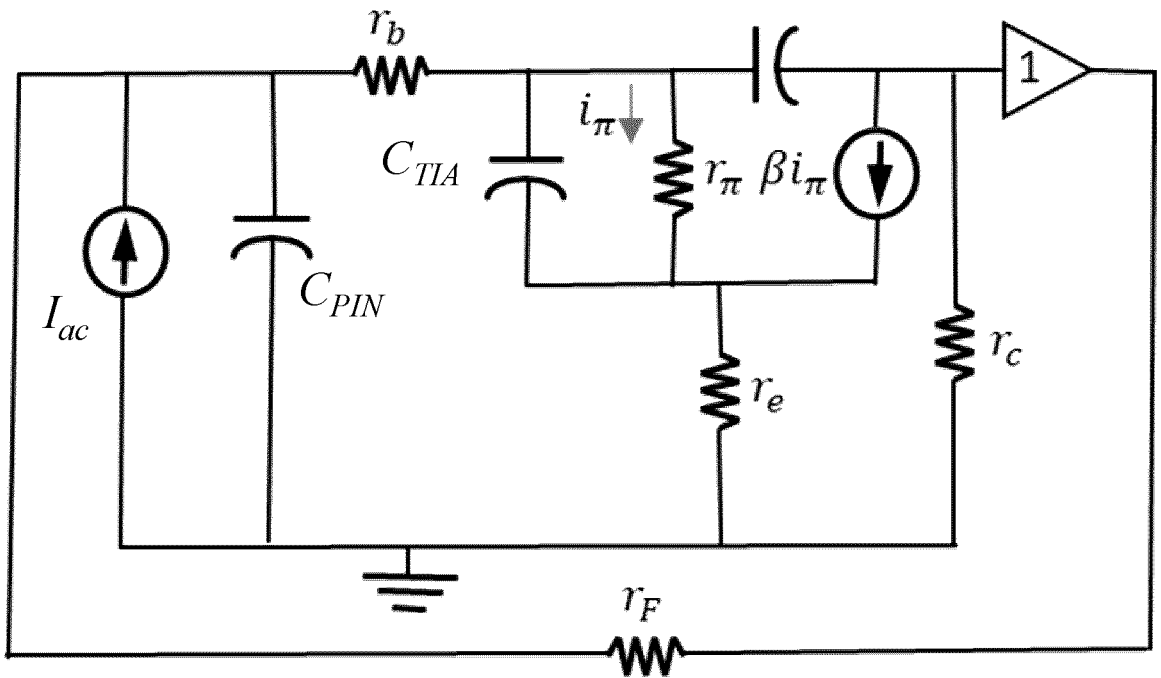
FIG. 16 shows a simplified equivalent circuit diagram the monolithically integrated PIN-TIA of the example embodiment showing device parameters of the PIN and of the first transistor Q1 of the TIA.

FIG. 15 is a circuit design schematic for an example embodiment of a monolithically integrated PIN-TIA, wherein the TIA comprises a three-stage amplifier with first, second and third HBTs, Q1, Q2 and Q3, and transimpedance feedback resistor $R_F$. In the simplified equivalent circuit shown FIG. 16, the PIN is shown as a circuit equivalent current source $I_{AC}$ with capacitance $C_{PIN}$. The first transistor Q1 of the TIA is modelled as a capacitance $C_{TIA}$, input resistance $r_\pi$, current source $\beta i_\pi$, based on current received from the PIN being $i_\pi$. Also shown are base, emitter and collector resistances $r_b$, $r_e$, and $r_c$, and feedback resistor $r_F$. The second and third stages of the TIA are represented schematically by amplifier 1.

An optimum noise reduction for a TIA first stage occurs when both the capacitance of the PD, $C_{PIN}$, and the capacitance of the first stage HBT Q1 can be minimized, and are comparable to each other. In principle, the capacitance of the HBT can be reduced by design, i.e. a mask set adjustment to provide a smaller gate length HBT. But, in practice, the combined device capacitance $C_{PIN}+C_{TIA}$ may be limited by how much $C_{PIN}$ can be reduced. Unless the PD capacitance can be comparably reduced, there may be limited benefit to reducing the capacitance of the HBT; and the cost and effort of design kit variations for a smaller gate length HBT may not make it worth attempting. In a hybrid PD-TIA, since the bond pad parasitics dominate, there may be limited benefit to reducing the device area of the PD to reduce $C_{PIN}$, because of the associated increased difficulty in optical fiber alignment to a PD with a smaller aperture. On the other hand, since the PIN device capacitance $C_{PIN}$ can be reduced significantly by monolithic integration of the PIN-TIA, by selecting a PIN with a smaller aperture, if packaging logistical issues with fiber alignment to a smaller aperture PIN are overcome, then the size of the first stage HBT can be comparably reduced, to reduce capacitance of the first stage HBT. This arrangement would lead to further improvements in noise, and therefore in receiver sensitivity.

Considering these design principles, in a monolithically integrated PIN-TIA of an example embodiment, the PIN capacitance $C_{PIN}$ is 50 fF, and the PIN is operated with a reverse bias voltage of 3.3V. The TIA is designed to match the capacitance of the TIA, $C_{TIA}$, to the PIN capacitance, i.e. $C_{TIA}$ is also 50 fF. The TIA comprises a three-stage transistor amplifier with a transimpedance feedback resistance $R_F$ of 1500Ω, calculated using the equation shown in FIG. 13, assuming the $f_T$ of InP HBT transistors is 100 GHz, and a bandwidth BW=7.5 GHz.

Figure 17:
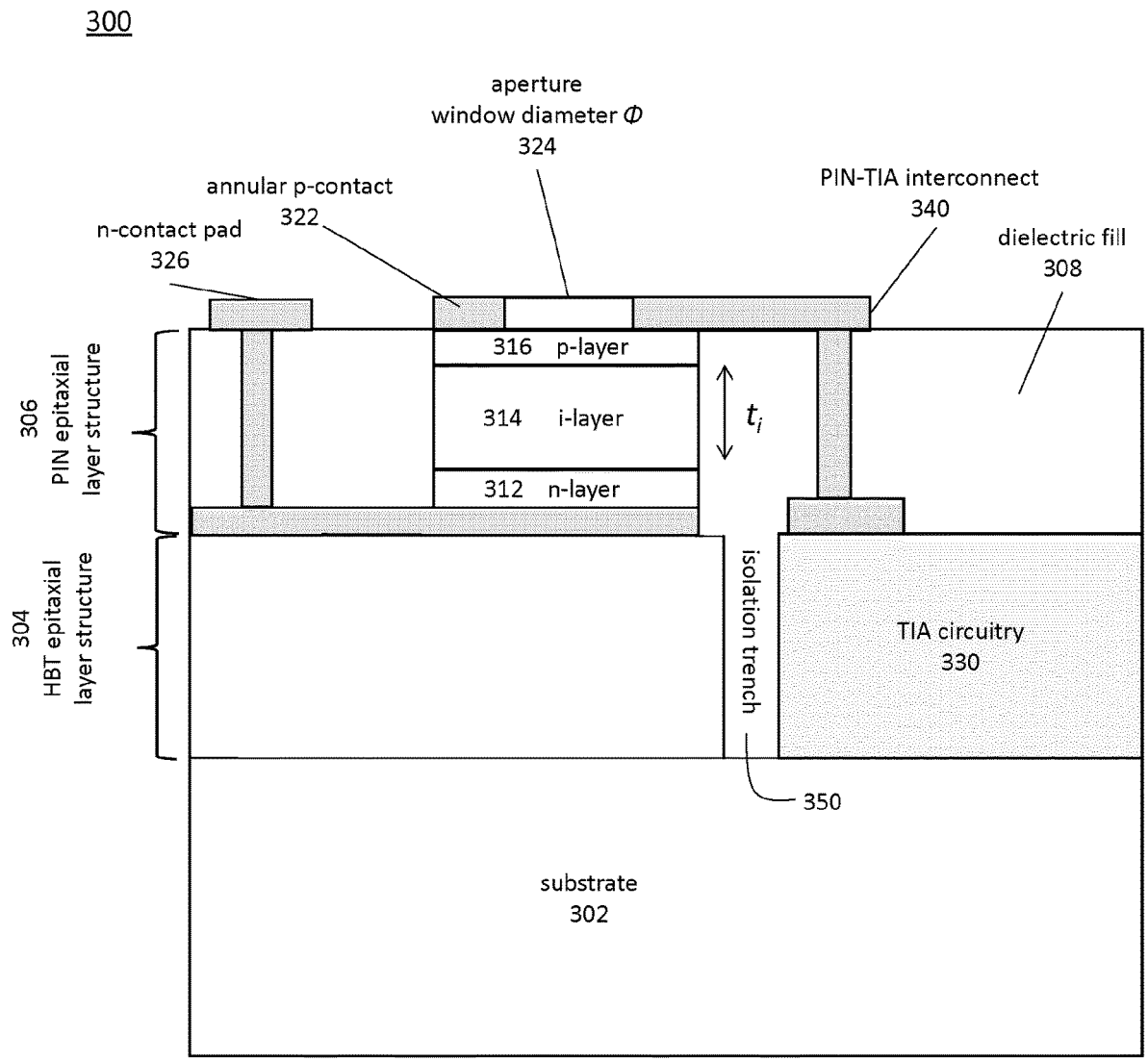
FIG. 17 shows a simplified schematic cross-sectional view of an integrated PIN-TIA of a first embodiment to illustrate direct interconnection of the PIN and TIA.

Design of the integrated PIN-TIA for improved sensitivity (i.e. a lower value, e.g. less than −28 dBm) and to achieve a specified responsivity, e.g. ≥0.7 A/W, requires recovering all photons possible, i.e. improving the quantum efficiency (QE) of the PIN. For a discrete PIN which is wire bonded to the TIA, this is not practical, because even if the thickness $t_i$ were increased towards infinity, i.e. to the point where transit time bandwidth dominates, the bond pad capacitance is a dominant factor in limiting the sensitivity. On the other hand, for a monolithically integrated PIN and TIA, where the sensitivity depends primarily on the PIN capacitance $C_{PIN}$, and not on the bond pad capacitance of the PIN, then multiple design options become possible to increase the QE of the PIN, e.g.:

a) increase the device thickness $t_i$ until transit time dominates, because pad capacitance is not dominating;

b) decrease device area A (e.g. aperture diameter Φ) because pad capacitance is not dominating;

c) for a given wavelength, insert a mirror, e.g. a reflector comprising quarter-wave stacks of alternating high/low index material to create a dual pass through the thickness $t_i$ of the i-InGaAs layer, to preserve low transit time while increasing the QE;

A schematic cross-sectional view through layers of an integrated PIN-TIA of a first embodiment 300 is shown in FIG. 17. The device structure comprises a substrate 302, e.g. SI:InP, on which is formed an epitaxial layer stack for the TIA circuitry and for the PIN device structure. A first plurality of semiconductor layers of an epitaxial layer stack provides an HBT epilayer structure 304 for the TIA circuitry 330. A second plurality of layers of the epitaxial layer stack form a PIN epilayer structure 306 for the PIN 320, comprising the n contact layer 327, n-layer 312, i-layer 314, p-layer 316, annular p-contact 322 having window 324 of diameter Φ. The p-contact 320 of the PIN 320 is interconnected to the TIA circuitry by PIN-TIA interconnect 340, which extends through dielectric fill 308. The TIA circuitry 330 is formed on a first area of the substrate which is isolated by an isolation trench 350 from a second area of the substrate on which the PIN 320 is formed. For example, a monolithically integrated InGaAs PIN and TIA comprising InP HBTs may be fabricated using commercially available InP process technology.

For 10G PON, the i-layer of the PIN comprises InGaAs, to provide for absorption at the transmission wavelength of the OLT, i.e. 1577 nm. The n-layers and p-layers of the PIN may be any suitable lattice matched material compatible with InGaAs. To reduce unwanted absorption, the aperture is preferably a material that is substantially transparent at the transmission wavelength, and may include an anti-reflection coating.

Fabrication comprises providing an epitaxial layer structure in which an HBT epi-layer structure is provided on the substrate, with an overlying PIN epi-layer structure. That is the TIA circuitry comprising InP HBTs is fabricated on the SI InP substrate, for high speed operation of the HBT. The InGaAs PIN is formed by overlying epitaxial layers, so that conductivity of the layers of the PIN epi-layer structure does not degrade speed and performance of the underlying TIA circuitry. Also, since the HBT epi-layers of the epitaxial layer stack forming the HBT electronics are distinct from the PIN epi-layers of the epitaxial layer stack forming the PIN, each can be optimized separately. If required a spacer comprising one or more intermediate layers between the HBT epi-layers and the PIN epi-layers may be provided, e.g. to provide electrical isolation, to act as an etch stop to facilitate processing, etc. As illustrated schematically, the area of the TIA circuitry may be isolated from the area of the PIN by a dielectric filled trench. By integration of the HBT electronic circuitry for the TIA and the PIN detector as illustrated schematically, layers of the HBT epi-layer stack and layers of the PIN epi-layer stack may be independently structured and optimized for improved device performance.

If required, materials of the epitaxial layer structure may be selected to be compatible with a single epitaxial growth, or alternatively, multiple epitaxial growths may be used, as appropriate. Different processes may be used for fabrication of the HBT epi-layers and PIN epi-layers. For example, in practice, MBE (Molecular Beam Epitaxy) may be used to provide the HBT epi-layers, and MOCVD (Metal Organic Chemical Vapor Deposition) may be used to provide the PIN epi-layers. A semi-insulating spacer may be provided between the HBT epi-layers and the PIN epi-layers. In other embodiments, it is preferred to select an epitaxial layer structure for the HBTs and the PIN which is compatible with single epitaxial layer growth.

Figure 21:
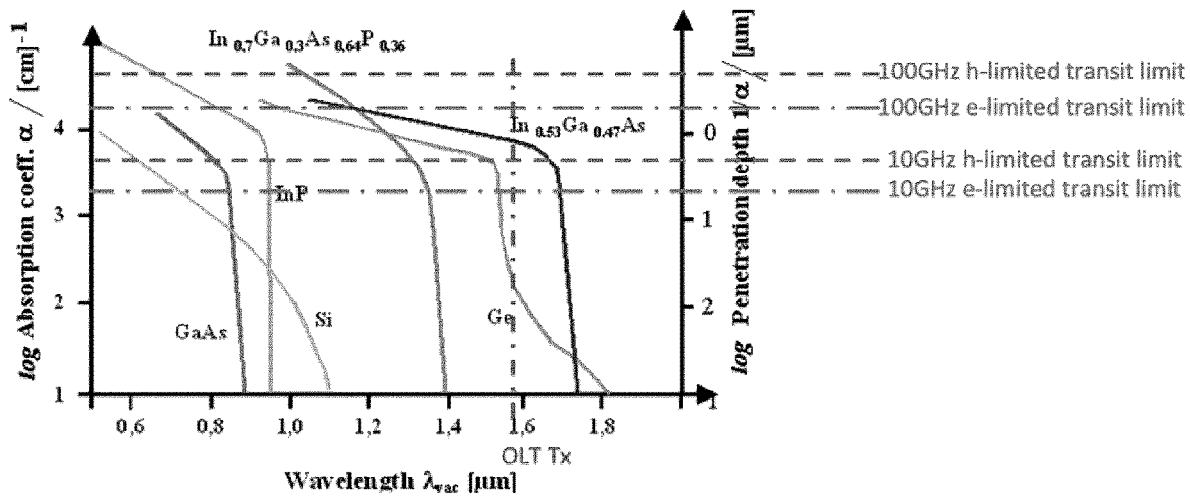
FIG. 21 shows a plot of absorption coefficient vs. wavelength for example semiconductor materials.

A specific design issue for an optical receiver for a 1577 nm ONU is that 1577 nm is close to the InGaAs band edge, in a region where the absorption coefficient is already lower (see FIG. 21). One absorption length at this wavelength is roughly 1.4 μm, compared to well under 1 μm for a wavelength of 1300 nm. This means that it is more difficult to maximize the quantum efficiency. However, because 1577 nm is closer to the InGaAs band edge, then a high/low index lattice-matched dielectric stack has a larger possible contrast in this materials system, meaning that it becomes practical to make a mirror or reflector, to get effectively two passes through the i-InGaAs layer, i.e. effectively doubling the absorption length.

Figure 18:
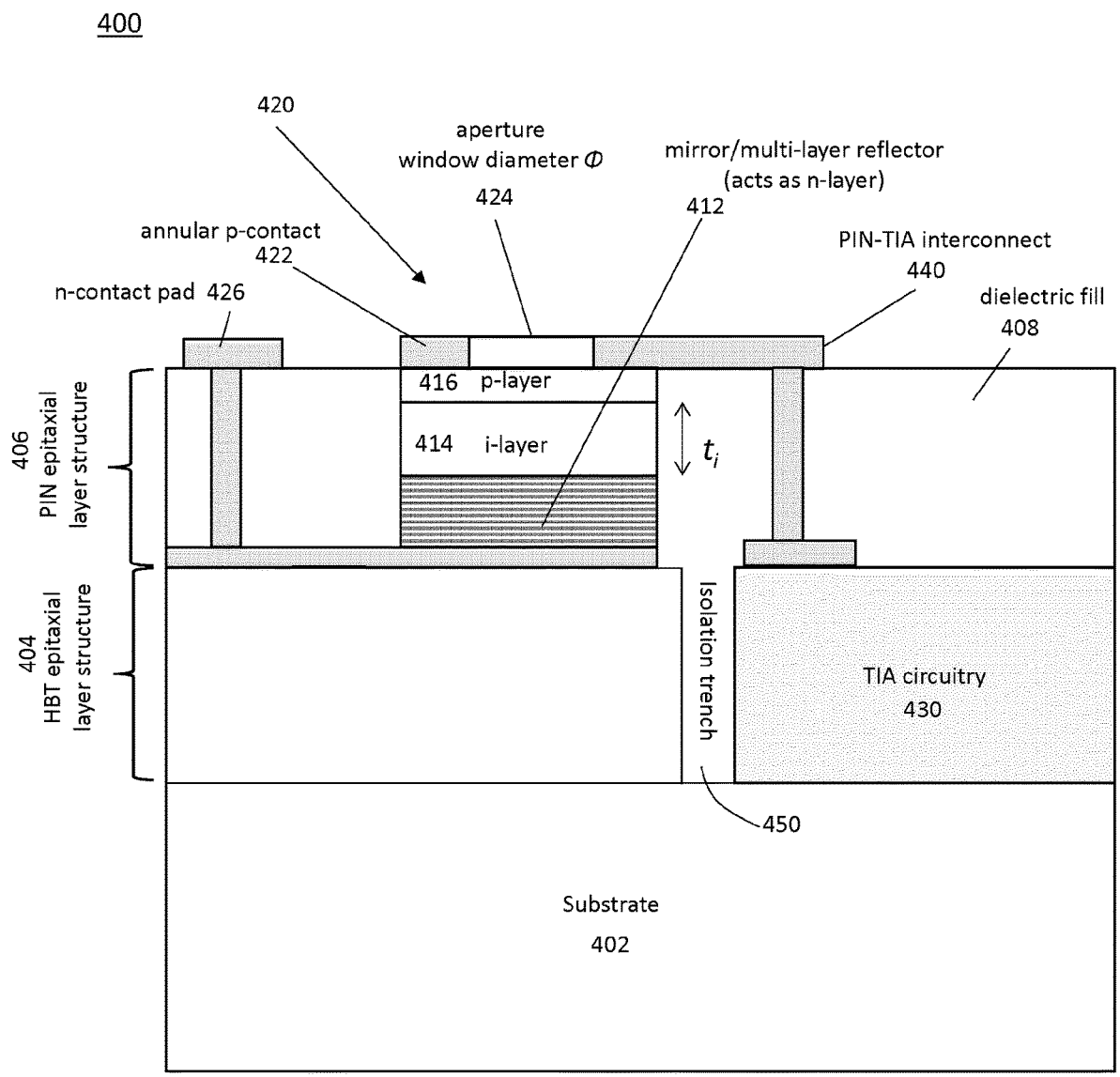
FIG. 18 shows a simplified schematic cross-sectional view of an integrated PIN-TIA of a second embodiment, comprising a multi-layer reflector (mirror)

As an example, FIG. 18 shows a schematic cross-sectional view of an integrated PIN-TIA device structure 400 of second example embodiment, comprising a mirror 412 inserted between the n-contact layer 427 and the i-InGaAs layer 414 of the PIN. For example, the mirror 412 comprises a multi-layer stack of alternating high index (e.g. n-doped semiconductor)/low index quarter-wave lattice-matched layers. The n-doped materials of the multi-layer stack acts as the n-layer of the PIN. The other layers of the PIN and TIA are structured as described with reference to FIG. 17. Elements of the device structure 400 which are similar to device structure 300 of FIG. 17 are labelled with the same reference numerals incremented by 100. Thus, the HBT epitaxial layer structure 404 for the TIA circuitry 430, and PIN epitaxial layer structure 406 for the PIN 420 are formed on the substrate 402. The PIN epitaxial layer structure comprises a multilayer reflector structure 412 which acts as the n-layer, i-layer 414 and p-layer 416. Annular p-contact 422, with aperture window 424 is connected by PIN-TIA interconnect 440, through dielectric fill 408, to the TIA circuitry. The TIA circuitry 430 is formed on a first area of the substrate which is isolated by an isolation trench 450 from a second area of the substrate on which the PIN 420 is formed.

Figure 19:
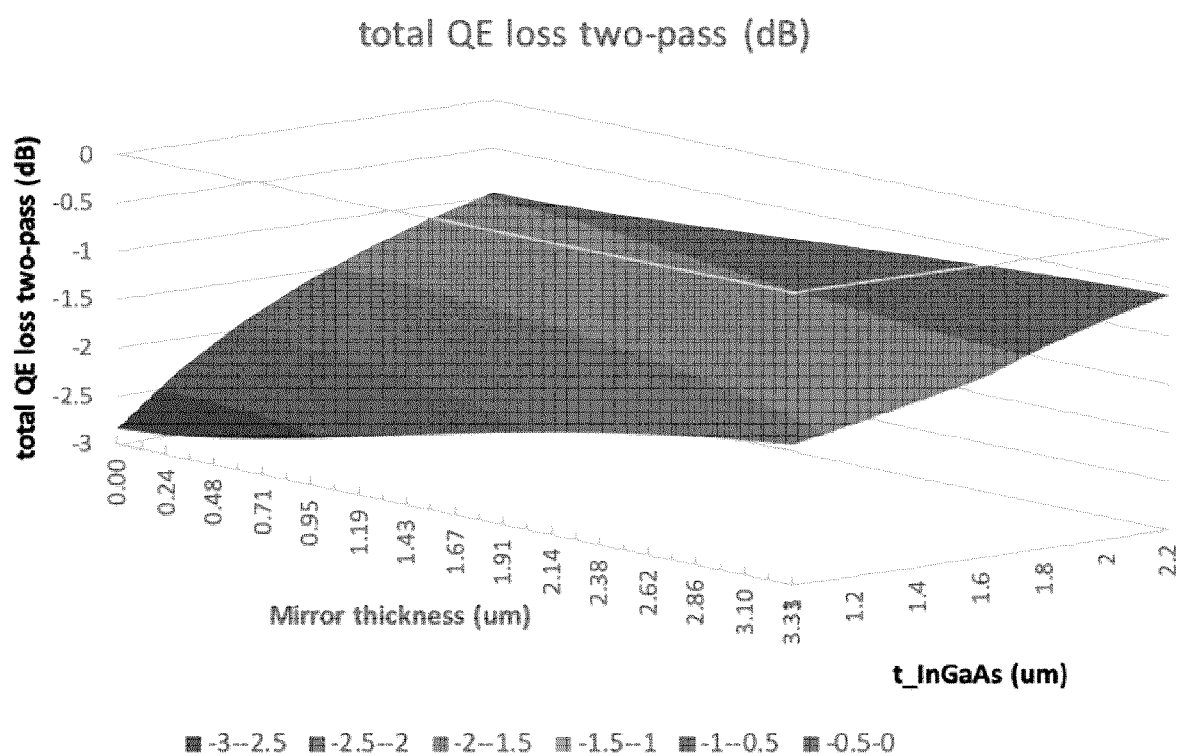
FIG. 19 shows a plot of simulated data to illustrate the effect of including a reflector as illustrated schematically in FIG. 18.

The graphical representation shown in FIG. 19 presents the results of some calculations to simulate the effect of adding a mirror. The starting point is the estimated nearly 3 dB QE loss from an existing state-of-the-art 56G or 28G PIN with a circular mesa and normal incidence, e.g. front entry geometry. By increasing the thickness of the i-InGaAs layer (labelled in FIG. 19 as t_InGaAs (μm)) along one horizontal axis of the plot), which becomes feasible because the parasitic capacitance of the bond pads of the PIN is no longer degrading the device performance, and adding a mirror having a mirror thickness (μm) (shown along the other horizontal axis of the plot), the simulation results show that the PIN can gain back somewhere between 1.5 to 2 dB in practical terms (see vertical axis for total QE loss for two-pass (dB)).

Thus, each of these design options, taken individually or in combination, enable fabrication of an optical receiver comprising a monolithically integrated PIN-TIA, with improved performance, e.g. to meet performance specifications for optical receivers for a 1577 nm ONU for 10G-PON. This design approach makes it feasible to replace a conventional hybrid APD and TIA with a monolithically integrated PIN-TIA of comparable sensitivity and responsivity. A monolithically integrated PIN-TIA implemented with commercially available InP process technology avoids the need for an APD and its high voltage power supply and control circuitry, and associated cost.

Since the example embodiments of monolithically integrated PIN-TIA herein has comparable sensitivity and responsivity to conventional/commercially available hybrid APD and TIA for 10G PON applications, the monolithically integrated PIN-TIA can be deployed in optical receivers for 1577 nm ONU for existing fiber networks, wherein the OLT use lasers providing a standard transmit power (e.g. DML 9 dBm or EML 4 dBm). Of course, use of higher transmit power lasers, which would relax required sensitivity specifications, may allow for further optimization of monolithically integrated PIN-TIA for next generation PON and other applications.

For some applications, it may be desirable to replace a discrete APD with a vertical PIN photodiode, as described above. Use of this design approach for monolithic integration of an APD and TIA using InP materials technology or monolithic integration of a waveguide PIN and a TIA based on InP materials technology is also contemplated as being feasible, and may have benefits for some high speed data applications. That is, reducing the photodetector capacitance may allow for optimization of other device parameters to provide for improved performance of optical receivers for other wavelengths covered by other types of InGaAs photodetector. In particular, elimination of pad capacitance for interconnection of the PIN and TIA allows for a higher transimpedance feedback resistance $R_F$ for higher transimpedance gain of the TIA.

In designing the TIA, reducing capacitance allows for a higher transimpedance feedback resistance $R_F$, to increase gain, and the TIA noise is inversely proportional to the feedback resistance $R_F$. It may be beneficial to match the capacitance of the TIA to the device capacitance of the PIN. Since there are a number of parameters that can be adjusted to achieve the required PIN-TIA performance, it may not be necessary to minimize the capacitance of the PIN. With respect to the ground pads of the PIN, it may be beneficial to use multiple pads, e.g. two pads will double capacitance, and halve inductance, e.g. use of multiple wire bonds for the ground pads reduces bond wire inductance (e.g. ~1 nH/mm for 25 μm bond wires). In designing the PIN, if the responsivity, i.e. A/W, of the PIN is made high enough, so that the SNR in the PIN is higher, the PIN provides a higher input signal to the TIA. This means even if the TIA is noisier (e.g. from lower $R_F$, from higher capacitance) the integrated PIN-TIA will provide improved SNR.

That is, for each of these examples, monolithic integration of the photodetector, whether the photodetector is a vertical InGaAs PIN (top facet window), an InGaAs APD or an InGaAs waveguide PIN (lateral facet window), or other type of photodiode, elimination of bond pad capacitance of the PD has a significant effect on improving device performance, and enabling other parameters of the photodetector and the TIA to be modified or optimized, e.g. to improve quantum efficiency and other parameters to meet required specifications of sensitivity, responsivity, et al. for applications such as 10G PON and other high data rate applications requiring high performance modulation schemes. In the embodiments described above comprising a vertical PIN, the PIN may have an area comprising an optical window, which is e.g. 16 µm to 20 µm in diameter. Since reducing the area of the PIN also reduces the capacitance, a smaller diameter PIN may be used in conjunction with a lens to match to the optical fiber spot size.

Monolithic integration of an InGaAs PIN using InP HBTs for the TIA provides a solution to a problem that is not easily solvable with silicon photonics comprising normal incidence, e.g. front-entry geometry, germanium (Ge) PINs. In the wavelength range of interest for 10G PON, Ge has a lower absorption coefficient then InGaAs (see FIG. 21), and 1577 nm is so close to the bandgap of Ge, that achieving high bandwidth and high responsivity simultaneously is quite difficult. In a Ge based system, it becomes necessary to use waveguide pin photodiodes or APDs to achieve both high responsivity and high bandwidth.

The monolithic integration approach described herein for reducing parasitic capacitances of the photodiode detector, and then adjusting other parameters of the PIN and TIA to improve quantum efficiency, e.g. to meet sensitivity and responsivity specification for high data rate applications may also be extendible to other types of photodiode detectors, e.g. unitary transit carrier (UTC) photodiode device structures and waveguide PIN geometries, et al.

Monolithic integration of the PIN-TIA eliminates hybrid integration parasitics such as, bond pad capacitances, wirebond resistance/inductance/etc., and direct interconnection of the PIN-TIA provides lower capacitance by eliminating bond pad capacitance, and provides a direct (short-length) lower inductance/lower resistance interconnection. Reduced bond pad capacitance provides associated degrees of freedom to provide improved bandwidth for a PIN of a given diameter and reduced noise.

The absorption layer thickness $t_i$ can be increased to improve responsivity. All else equal, an integrated pin-TIA will permit a greater overall bandwidth.

A semiconductor mirror can be inserted under the multiplication region to boost the reflectance. FIG. 19 shows the benefit of increasing either the absorption, the reflectance or both. Calculations for FIG. 19 were based on published data disclosed in an article by J. Brouckaert et al. (J. Lightwave Technology, Vol. 25, No. 4, April 2007). It is worth pointing out explicitly that at 1577 nm, a significantly greater contrast in refractive index is possible for the semiconductor mirror than, say, at 1.3 µm, or even for 1.50 µm. This is because a lower energy bandgap, and therefore higher refractive index, semiconductor can be used for the higher index transparent semiconductor, owing to the proximity between 1577 nm and the InGaAs bandgap wavelength of approximately 1650 nm. The mirror can be used either to supplement or replace lost (i.e. reduced) QE at 1577 nm. If $C_{PIN}$ is reduced, the highest bandwidth can be achieved for thinner t_InGaAs, (referred to as ti in other paragraphs), but at the cost of single-pass responsivity. A mirror, as described herein, can recover a significant amount of the non-absorbed light. In principle, the mirror can be made close to 100% reflecting, albeit at the cost of processing topography issues from a thick mirror. However. this issue has been addressed for standard VCSEL processing, which relies on the same principle. On the other hand, for application to ONU receivers operating at 1577 nm, the refractive index contrast possible in this application means that near 100% reflectivity could be achieved with fewer layers, and therefore less thickness (i.e. relative to that typically required for a VCSEL), which is a design-for-processing advantage.

Further Design Improvements

In a monolithically integrated PIN-TIA of a prototype embodiment, fabricated with an InGaAs PIN and TIA circuitry comprising InP HBTs, a responsivity of 0.69 A/W was achieved at 1550 nm. Based on the design methodology described herein, this responsivity can be improved by one or more of:

Increased absorption layer thickness: for an OLT application at 1557 nm there is room to increase the thickness $t_i$ without approaching the bandwidth limit. Based on empirical data combined with literature data and modeling, increasing the absorption layer thickness by just over 1.5× should give a 1 dB improvement.

Mirror provided below the absorption layer or RCE: If a mirror is provided, then we would expect >90% QE possible (and maybe 95%) for the OLT application. For 25 GHz operation, we would expect >85% QE (and maybe 90%) is possible.

Reduced absorption in other layers, e.g. p+ cap layer: a p+ cap layer provides reduced sheet resistance and contact resistance for the p-contact, but signal may be lost due to optical absorption. For example, thinning this layer or selecting a material, e.g. a lattice-matched InGaAlAsP composition (probably a quaternary, e.g. either InGaAlAs or InGaAsP) which transparent to 1.577 µm but close to the bandgap, may be a little worse for sheet and contact resistance but provide improved optical transmission. This same composition could probably be used for the higher refractive index layers of the mirror.

Anti-reflection coating: providing an antireflection coating optimized for the operating wavelength of 1.577 µm.

Monolithically Integrated PD-TIA of Other Embodiments

In other embodiments, the design principles disclosed herein for monolithic integration a PIN-TIA comprising an InGaAs PIN and a TIA circuitry fabricated with InP HBTs may be extended to monolithic integration of other types of photodiode with a TIA. Other types of photodiode detectors include, e.g. a Uni-Travelling Carrier (UTC) PD; a waveguide PIN; a resonance enhanced cavity PD; and an APD. To the Applicant's knowledge, monolithic integration of these types of PD with a TIA is not generally considered. However, to the extent that these device structures can be fabricated to be compatible with HBT technology, e.g. InP HBTs, or HBTs fabricated with other compatible semiconductor materials systems, other options for monolithically integrated PD-TIA with improved performance include the following types of PD:

UTC (uni-travelling carrier) PD. For further bandwidth improvement, a UTC PD design could be used. The benefits of UTC are well-understood. This design is likely to be compatible with HBT technology.

Waveguide pin. A waveguide pin can get as close to 100% responsivity as possible. For ultra-high speed and near-100% responsivity this may need to be accompanied by a traveling wave electrical signal. Traveling wave waveguide pins and modulators are well known in the literature.

Resonance enhanced cavity photodiode (or Resonant cavity enhanced (RCE) PD). This is an interesting option, because the basic idea is to use mirrors to get multiple, not just two, passes through the absorption region for maximum absorption for minimum absorption layer thickness. This device structure also provides a high selectivity of QE vs. wavelength, i.e. one wavelength of absorption is favored. This arrangement would work well for OLT having a well-defined specific wavelength, e.g. 1577 nm, or other applications for which the wavelength is well defined. The transit time is quite fast because the absorption layer is thin, and the performance is limited by capacitance. Eliminating bond pad capacitance through monolithic integration with a TIA, presents an attractive route to achieving a minimum, or at least substantially reduced, absorption thickness limit for a given bandwidth, to increase or maximize the advantage of resonant cavity enhancement.

APD. Currently available APDs struggle to get the bandwidth at 10 GHz and above. Monolithic integration of an APD and TIA reduces the device capacitance $C_{APD}$ of the APD, allowing, by an argument analogous to that above, a better chance of achieving a required bandwidth. Si APDs are known to be far superior to InP-based APDs in terms of excess noise, because of primarily electron injection into the multiplication region.

Although there are significant improvements to InP-based APDs, the carrier ratio at high gain implies that there is limited gain-bandwidth (GBW) product; further implying the need for additional improvements to make InP APDs practical for ultra-high speed use. For a monolithically integrated InP APD-TIA, a goal would be to try to reduce the carrier transit time. The transit time is multiplied by two for a SAGCM (Separate Absorption, Grading, Charge and Multiplication) APD, once to get the carriers to the multiplication region, and the other for the multiplied carriers to return to the opposite contact area. In this design, the PD capacitance would be increased, which would not usually be desirable, but this increase in capacitance is compensated for by the reduced capacitance of the monolithically integrated APD-TIA. The responsivity would decrease due to less absorption region, but the decreased absorption could be compensated for by a semiconductor mirror stack, e.g. as described with reference to FIG. 19.

Comparison with Silicon Photonics.

Silicon photonics (SiPh) is well known for integration of a PD with electronic circuitry; e.g. integration of circuitry with a PD that may be a pin PD or APD, waveguide or circular (i.e. normal incidence) geometry. Many of these applications for coherent communications require sufficiently fast PDs (usually pin photodiodes), e.g. for establishing the relative phase for QPSK and higher order QAM, high performance modulation schemes. For applications such as phase comparators, etc., implementing circuitry in silicon technology is straightforward. SiPh tends to use CMOS circuitry, with BJTs, e.g. for pads/macros, but not necessarily HBTs, which have a significant advantage over BJTs for $f_T$, etc. To the Applicants knowledge, very few SiPh applications use a monolithically integrated PD with a TIA, which may be, for example, because effective CMOS circuitry requires smaller geometry (i.e. characterized by shorter transistor gate length) than would be economically effective.

Figure 20:
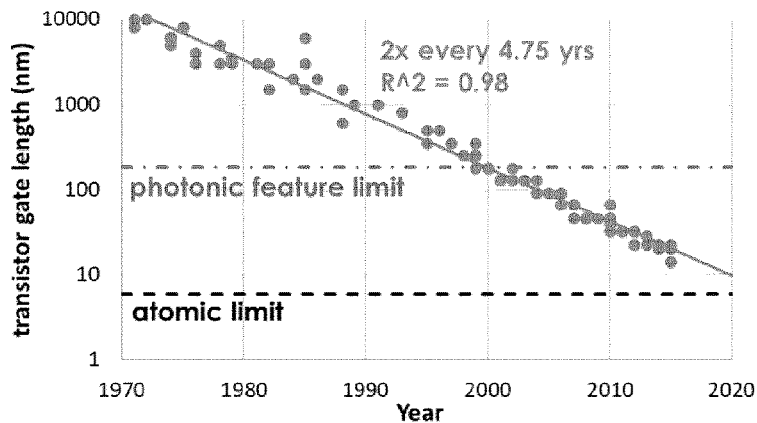
FIG. 20 shows a Moore's law plot of transistor gate length (nm) over the last 50 years.

The graph in FIG. 20 illustrates this from a Moore's Law perspective (the data comes from plotting data points available in Wikipedia a few years ago). Any technology below the photonic feature limit is suitable for silicon photonics. Gate length developments over the last half century will soon run into the atomic limit. Since the turn of the 21st century it has been possible to do silicon photonics, but at that time, it would have been expensive. What makes SiPh economical now is the march down the Moore's Law curve, making obsolete for silicon integrated circuits (ICs) what is perfectly fine for SiPh (e.g. 130 nm gate length technology), leaving existing fabs looking for business in gate length technologies no longer used by silicon ICs. The technologies needed to fabricate the best TIAs are expensive, or, to fabricate the TIAs in an obsolete technology for a cutting edge speed would either not be possible, or perhaps too costly due to the total die area needed for an obsolete technology. For example, a SiPh photonic integrated circuit having acceptable performance may be fabricated with lower cost Si process technology, e.g. 0.13-0.25 µm, on moderate diameter wafers (e.g. 8 inch), instead of more costly state-of-the-art, e.g. 5-14 nm technology. Consequently, TIAs are not generally fabricated using SiPh technology.

Optical Line Terminals (OLT) for PON Applications

For Optical Line Terminals (OLT) for PON applications, in particular, there is another reason relating to the PD itself why implementation using SiPh is difficult. 1577 nm is close to (or maybe even exceeding) the Ge bandgap energy. Ge is handicapped relative to InGaAs for absorption at this wavelength. If we translate absorption length (which represents 1-1/e, or 63% QE) to transit time requirement, even if the capacitance of the device were zero, the graph in FIG. 21 clearly illustrates the argument. The horizontal blue lines depict for the OLT 1577 nm application the hole (blue) and electron transit time limits (green) for 10 GHz and 100 GHz—above this line there is sufficient absorption and below the line there is not. The vertical line represents the target wavelength of interest for the OLT transmission wavelength of 1577 nm, and therefore the ONU reception wavelength, for this particular application. Since the Ge curve falls below the horizontal lines at 1577 nm, it is difficult to achieve good absorption in Ge for a normal-incidence geometry PD, whereas for InGaAs this is readily possible for 10 GHz and beyond, although not at 100 GHz. Also, there is increasing QE for a given InGaAs thickness for electron transport (see UTC argument below) than for hole transport (which dominates a normal incidence pin for which the absorption layer is not very thin relative to an absorption length. It is difficult to achieve good absorption in Ge for a circular i.e. normal incidence geometry PD, whereas for InGaAs this is readily possible. So, although 1577 nm stresses somewhat the QE vs bandwidth trade-off for InGaAs, this same wavelength makes circular, normal incidence, geometry Ge-based PDs with acceptable QE quite difficult. One would have to resort to a waveguide geometry for the Ge, if the absorption coefficient is high enough for that even to be done (1) without scattering, etc., by the usual imperfections in fabricated waveguides, and (2) to get the traveling wave of the electrical signal well enough matched for what would be a very long waveguide, which for high speed requires traveling wave.

Thus, implementation of a monolithically integrated PIN-TIA with a Ge PD in SiPh presents design and fabrication challenges and presents a "path of high resistance" to practical application. By comparison, monolithic integration of an InGaAs PIN and a TIA fabricated with InP HBTs as described herein, provides a path of "reduced resistance" to practical application, e.g. for OLT and ONU operating at 1.270 µm or 1.577 µm. Other absorption materials within the InGaAlAsP penternary system, lattice matched to InP can be used, but of all these, InGaAs lattice matched to InP has the lowest bandgap energy, is direct bandgap, and has the highest absorption coefficient near 1.3 µm or 1.5 µm, for the OLT and ONU or other typical applications at these wavelengths.

INDUSTRIAL APPLICABILITY

At the time of filing of U.S. 62/950,479, optical receivers for OLT and ONU for 10G PON and high speed data center interconnect use optical receivers comprising hybrid integrated APD and TIA, because APD have higher sensitivity than currently available pin PD at these operating wavelengths. For example, for a receiver for an ONU with an operating wavelength of 1577 nm, existing pin PDs do not have enough sensitivity to replace APDs for this application. This is, in part, because transmitted laser power is limited. In future, with higher power lasers, and a sufficiently sensitive pin PD and TIA, it would be possible to replace an avalanche photodiode and TIA with a pin photodiode and TIA. However, for 10G PON systems, operating at these wavelengths with available laser power, per current industry standards, another solution is needed.

In the approach described herein, a monolithically integrated PIN-TIA is disclosed, which has comparable sensitivity to a hybrid APD-TIA. A design methodology is presented for optimizing parameters of the monolithically integrated PIN-TIA to meet required specification for applications such as, optical receivers for ONU and OLT for 10G PON, operating at wavelengths in the ranges of ~1.5 µm and ~1.3 µm. Monolithic integration of a PIN and TIA with a direct on-chip interconnection of the PIN and TIA eliminates parasitics comprising bond pad capacitance and bondwire inductance, allowing for design improvements for enhanced performance. In particular, by reducing the device capacitance $C_{PIN}$ of the PIN, and correspondingly designing the TIA to reducing the capacitance $C_{TIA}$ of the TIA, reduces the combined device capacitance $C_{PIN}+C_{TIA}$, for increased sensitivity. Preferably the device capacitance is reduced sufficiently, so that other effects dominate, i.e. reduced device capacitance allows for associated degrees of freedom to select or optimize other device parameters for improved performance. For example, increasing the thickness $t_i$ of the i-layer, or including a reflector to create a dual-pass of absorbed light, to effectively double the absorption length to two times $t_i$, increases QE and responsivity (A/W). In combination with selecting or optimizing other device parameters, e.g. the device area or diameter, a monolithically integrated PIN-TIA can be implemented, e.g. using an InGaAs PIN and TIA circuitry comprising InP HBTs, which provides sensitivity comparable to a hybrid APD-TIA currently used for this application.

In other embodiments, other types of PD are monolithically integrated with a TIA, using similar design principles, which reduce PD capacitance, and optimize other parameters comprising: the thickness $t_i$ of the i-layer, or effective absorption thickness of $2 \cdot t_1$ if a mirror is included; an aperture diameter or device area; capacitance of the TIA and feedback resistance of the TIA; for improved performance of optical receivers for 10G PON, and for other high speed data applications, e.g. optical interconnect for datacentre and 5G applications.

Although embodiments of the invention have been described and illustrated in detail, it is to be clearly understood that the same is by way of illustration and example only and not to be taken by way of limitation, the scope of the present invention being limited only by the appended claims.

The invention claimed is:

1. An optical receiver comprising a monolithically integrated photodiode (PD) and transimpedance amplifier (TIA), wherein:
   an epitaxial layer stack is formed on a semi-insulating indium phosphide (SI:InP) substrate;
   the TIA comprises InP heterojunction bipolar transistors (HBT) formed by a first plurality of semiconductor layers of the epitaxial layer stack formed on the SI:InP substrate;
   the PD comprises a p-i-n diode (PIN) formed by a second plurality of semiconductor layers of the epitaxial layer stack, comprising an n-layer, an i-layer and a p-layer, the second plurality of semiconductor layers being formed on top of the first plurality of semiconductor layers of the epitaxial layer stack;
   a p-contact of the PIN is directly interconnected by a conductive trace to an input of the TIA, to provide a device capacitance $C_{PIN}$ of the PIN, and a capacitance $C_{TIA}$ of the TIA; and
   device parameters comprising values of: $C_{PIN}$, $C_{TIA}$, a thickness $t_i$ of the i-layer, an area of the PIN; and a transimpedance feedback resistance $R_F$ of the TIA are selected to provide an integrated PIN-TIA meeting performance specifications comprising a specified sensitivity and responsivity at an operational wavelength.

2. The optical receiver of claim 1 wherein the i-layer comprises InGaAs.

3. The optical receiver of claim 1, wherein the i-layer is selected from materials of the group comprising InGaAs and other absorption materials within the InGaAlAsP penternary system.

4. The optical receiver of claim 1, wherein values of $C_{PIN}$ and $C_{TIA}$ provide at least one of:
   a) $C_{PIN}$ is matched to $C_{TIA}$;
   b) $C_{PIN}$ is approximately equal to $C_{TIA}$; and
   c) a minimum combined capacitance ($C_{PIN}+C_{TIA}$).

5. The optical receiver of claim 1, wherein $C_{PIN}$ is ≤50fF.

6. The optical receiver of claim 1, wherein $C_{PIN}$ is ≤30fF.

7. The optical receiver of claim 1, wherein $C_{PIN}$ is ≤15fF.

8. The optical receiver of claim 1, wherein the specified sensitivity and responsivity meet performance specifications for a receiver of an Optical Network Unit (ONU) for 10G PON.

9. The optical receiver of claim 8, wherein said device parameters are optimized for an operational wavelength of 1577 nm.

10. The optical receiver of claim 1, wherein the specified sensitivity and responsivity meet performance specifications for a receiver of an Optical Line Terminal (OLT) of a 10GPON.

11. The optical receiver of claim 10, wherein said device parameters are optimized for operation at 1270 nm.

12. The optical receiver of claim 1, wherein the specified sensitivity is equal to or better than −28 dBm.

13. The optical receiver of claim 1, wherein the specified sensitivity is equal to or better than −30 dBm.

14. The optical receiver of claim 1, wherein the specified responsivity is ≥0.6 A/W.

15. The optical receiver of claim 1, wherein the specified responsivity is ≥0.8 A/W.

16. The optical receiver of claim 1, wherein the specified responsivity is ≥1.0 A/W.

17. The optical receiver of claim 1, having a Quantum Efficiency≥85% or more preferably ≥90%.

18. The optical receiver of claim 1, wherein the HBT are characterized by $f_T$≥100 GHz, the TIA has a bandwidth (BW) of ≥7.5 GHZ, $C_{PIN}$ is ≤50fF, $C_{TIA}$ is ≤50fF and $R_F$≥1500Ω.

19. The optical receiver of claim 18, wherein $C_{PIN}$ is ≤30fF, and $C_{TIA}$ is ≤30fF.

20. The optical receiver of claim 18, wherein $C_{PIN}$ is ≤15fF, and $C_{TIA}$ is ≤15fF.

21. The optical receiver of claim 1, wherein:
   the p-layer comprises one of a single layer and a multilayer structure;
   the i-layer comprises one of a single layer and a multilayer structure; and the n-layer comprises one of a single layer and a multi-layer structure.

22. The optical receiver of claim 1, wherein the PIN comprises a vertical PIN having a top facet window.

23. The optical receiver of claim 22, comprising a mirror underlying the i-layer, to create a dual-pass through the i-layer.

24. The optical receiver of claim 23, wherein the mirror comprises a multi-layer quarter-wave stack of alternating high index and low index lattice matched materials.

25. The optical receiver of claim 23, wherein said device parameters comprise a mirror thickness $t_m$ of the multi-layer quarter wave stack, and wherein the thickness $t_i$ of the i-layer and the mirror thickness $t_m$ are selected to obtain a required Quantum Efficiency.

26. The optical receiver of claim 22, comprising at least one of:
 a) the top facet window of the PIN comprises an anti-reflection coating optimized for the operational wavelength;
 b) a p+ cap layer of the PIN is selected to be substantially transparent at the operational wavelength; and
 c) the p+ cap layer is a material selected to have a thickness and optical properties that reduce or minimize optical losses rather than reducing or minimizing sheet resistance and contact resistance for the p-contact.

27. An optical receiver for one of an OLT (Optical Line Terminal) and ONU (Optical Network Unit) of a 10G Passive Optical Network (PON) comprising:
 a monolithically integrated photodiode (PD) and a transimpedance amplifier (TIA), wherein:
 an epitaxial layer stack is formed on a semi-insulating indium phosphide (SI:InP) substrate;
 the TIA comprises InP (indium phosphide) heterojunction bipolar transistors (HBT) formed by a first plurality of semiconductor layers of the epitaxial layer stack grown on the SI:InP substrate;
 the PD comprises a p-i-n diode (PIN) formed by a second plurality of semiconductor layers of the epitaxial layer stack comprising an n-layer, an i-layer and a p-layer, the second plurality of semiconductor layers being formed on top of the first plurality of semiconductor layers of the epitaxial stack;
 a p-contact of the PIN diode is directly interconnected by a conductive trace to an input of the TIA; and
 the i-layer comprises absorption material selected for an operational wavelength of one of the OLT and the ONU.

28. The optical receiver of claim 27, for an ONU, wherein the i-layer comprises a single layer or a multi-layer structure comprising material that absorbs at 1577 nm.

29. The optical receiver of claim 27, for an OLT wherein the i-layer comprises a single layer or a multi-layer structure comprising material that absorbs at 1270 nm.

30. The optical receiver of claim 27, wherein the i-layer is selected from the group comprising InGaAs and other absorption materials of the InGaAlAsP materials system, which are lattice matched to InP.

31. The optical receiver of claim 1, wherein the PIN comprises a waveguide PIN having a lateral facet window.

32. The optical receiver of claim 1, wherein the first plurality of semiconductor layers and the second plurality of semiconductor layers are separated by a semi-insulating spacer.

* * * * *